(12) United States Patent
Kim

(10) Patent No.: US 11,810,906 B2
(45) Date of Patent: Nov. 7, 2023

(54) STRETCHABLE DISPLAY DEVICE

(71) Applicant: LG Display Co., Ltd., Seoul (KR)

(72) Inventor: Seulki Kim, Paju-si (KR)

(73) Assignee: LG Display Co., Ltd., Seoul (KR)

(*) Notice: Subject to any disclaimer, the term of this patent is extended or adjusted under 35 U.S.C. 154(b) by 452 days.

(21) Appl. No.: 16/920,194

(22) Filed: Jul. 2, 2020

(65) Prior Publication Data

US 2021/0028155 A1 Jan. 28, 2021

(30) Foreign Application Priority Data

Jul. 25, 2019 (KR) .................. 10-2019-0090044

(51) Int. Cl.
*H01L 27/12* (2006.01)
*H01L 27/15* (2006.01)
(Continued)

(52) U.S. Cl.
CPC ............ *H01L 25/167* (2013.01); *G09F 9/301* (2013.01); *H01L 25/0753* (2013.01); *H01L 27/124* (2013.01); *H01L 27/156* (2013.01); *H05K 1/0283* (2013.01); *H01L 33/62* (2013.01); *H05K 1/0268* (2013.01); *H05K 1/147* (2013.01); *H05K 2201/09263* (2013.01);
(Continued)

(58) Field of Classification Search
CPC .... G09F 9/301; H05K 1/0268; H05K 1/0283; H05K 1/147; H05K 2201/09263; H05K 2201/10106; H05K 2201/10128; H05K 2201/2009; H05K 2203/162; H01L 25/0753; H01L 25/167; H01L 27/124; H01L 27/156; H01L 27/3253; H01L 27/3276; H01L 27/3293; H01L 33/62; H01L 2251/5338; H10K 2102/311
See application file for complete search history.

(56) References Cited

U.S. PATENT DOCUMENTS

2001/0015626 A1* 8/2001 Ozawa ................. G09G 3/3225
    315/168
2006/0067143 A1* 3/2006 Kim ...................... H01L 27/124
    365/201

(Continued)

FOREIGN PATENT DOCUMENTS

KR 10-2008-0062264 A 7/2008
KR 10-1810050 B1 12/2017

*Primary Examiner* — Herve-Louis Y Assouman
*Assistant Examiner* — Christopher M Roland
(74) *Attorney, Agent, or Firm* — Seed IP Law Group LLP

(57) ABSTRACT

A stretchable display device according to one or more embodiments of the present disclosure includes a lower substrate including a display area, a first non-display area disposed at a left side and a right side of the display area, and a second non-display area disposed above and below the display area and the first non-display area, a plurality of first substrates disposed on the lower substrate in the display area and defining a plurality of pixels, a plurality of second substrates disposed on the lower substrate in the first non-display area and including a gate driver disposed thereon, and an inspection unit disposed on the lower substrate in the second non-display area and including a plurality of inspection substrates connected to a second substrate which is the most adjacent to the second non-display area among the plurality of second substrates.

19 Claims, 10 Drawing Sheets

(51) Int. Cl.
*H05K 1/14* (2006.01)
*H01L 33/62* (2010.01)
*H01L 25/16* (2023.01)
*G09F 9/30* (2006.01)
*H05K 1/02* (2006.01)
*H01L 25/075* (2006.01)
*H10K 102/00* (2023.01)

(52) U.S. Cl.
CPC ............ *H05K 2201/10106* (2013.01); *H05K 2201/10128* (2013.01); *H05K 2201/2009* (2013.01); *H05K 2203/162* (2013.01); *H10K 2102/311* (2023.02)

(56) References Cited

U.S. PATENT DOCUMENTS

| | | | |
|---|---|---|---|
| 2016/0041412 A1* | 2/2016 | Lv | G02F 1/1309 324/760.02 |
| 2018/0046221 A1* | 2/2018 | Choi | G02B 26/0825 |
| 2020/0111978 A1* | 4/2020 | Kim | H01L 27/1218 |
| 2021/0098555 A1* | 4/2021 | Kim | H01L 27/326 |
| 2021/0408204 A1* | 12/2021 | Zhao | H01L 27/3276 |

* cited by examiner

STRETCHABLE DISPLAY DEVICE

CROSS-REFERENCE TO RELATED APPLICATIONS

This application claims the priority of Korean Patent Application No. 10-2019-0090044 filed on Jul. 25, 2019, in the Korean Intellectual Property Office, the disclosure of which is incorporated herein by reference.

BACKGROUND

Technical Field

The present disclosure relates to a stretchable display device, and more particularly, to a stretchable display device which easily detects a defect of a driver to improve a reliability.

Description of the Related Art

As display devices which are used for a monitor of a computer, a television, or a cellular phone, there are an organic light emitting display device (OLED) which is a self-emitting device, a liquid crystal display device (LCD) which requires a separate light source, and the like.

An applicable range of the display device is diversified to personal digital assistants as well as monitors of computers and televisions and a display device with a large display area and a reduced volume and weight is being studied.

Recently, a stretchable display device which is manufactured by forming a display unit and a wiring line on a flexible substrate such as plastic which is a flexible material so as to be stretched in a specific direction and changed in various forms is getting attention as a next generation display device.

BRIEF SUMMARY

The present disclosure provides a stretchable display device which easily inspects a defect of a gate driver mounted in the stretchable display device.

The present disclosure provides a stretchable display device which implements an inspection unit which is capable of inspecting a defect of a gate driver in a limited area.

The present disclosure provides to a stretchable display device which easily detects a defect of a driver to improve a reliability.

Benefits of the present disclosure are not limited to the above-mentioned benefits, and other advantages, which are not mentioned above, can be clearly understood by those skilled in the art from the following descriptions.

In order to achieve the above-described benefits, according to an aspect of the present disclosure, a stretchable display device includes a lower substrate including a display area, a first non-display area disposed at a left side and a right side of the display area, and a second non-display area disposed above and below the display area and the first non-display area, a plurality of first substrates disposed on the lower substrate in the display area and defining a plurality of pixels, a plurality of second substrates disposed on the lower substrate in the first non-display area and including a gate driver disposed thereon, and an inspection unit disposed on the lower substrate in the second non-display area and including a plurality of inspection substrates connected to a second substrate which is the most adjacent to the second non-display area among the plurality of second substrates. Accordingly, the inspection unit which inspects the gate driver is disposed in the stretchable display device to easily detect a defect of the gate driver.

According to another aspect of the present disclosure, a stretchable display device includes a lower substrate including a display area and a non-display area which encloses the display area, a plurality of first substrates defining a plurality of pixels and disposed in the display area to be spaced apart from each other, a plurality of second substrates disposed in a left non-display area at a left side of the display area and in a right non-display area at a right side of the display area, in the non-display area, gate drivers disposed on the plurality of second substrates and including a plurality of stages, and a plurality of inspection substrates disposed in an upper non-display area above the display area and a lower non-display area below the display area in the non-display area and having a plurality of inspection patterns disposed thereon. A gate signal output from an uppermost stage disposed on an uppermost second substrate which is the most adjacent to the upper non-display area among the plurality of stages is transmitted to the plurality of pixels and the plurality of inspection patterns. A gate signal output from a lowermost stage disposed on a lowermost second substrate which is the most adjacent to the lower non-display area among the plurality of stages is transmitted to the plurality of pixels and the plurality of inspection patterns. Accordingly, the inspection unit which inspects the defect of the gate driver is configured with a minimum configuration which inspects an initial gate signal and a final gate signal so that the inspection unit may be easily disposed in a limited area.

Other detailed matters of the embodiments are included in the detailed description and the drawings.

According to the present disclosure, an inspection unit which is connected to a gate driver in a stretchable display device and has a reduced area or minimum area is disposed to easily detect a defect of a driver.

According to the present disclosure, an outer peripheral portion of the stretchable display device is utilized to dispose an inspection unit of a gate driver.

The technical benefits according to the present disclosure are not limited to the contents exemplified above, and more various benefits can be readily appreciated by a person skilled in the art based on the present disclosure.

BRIEF DESCRIPTION OF THE SEVERAL VIEWS OF THE DRAWINGS

The above and other aspects, features and other advantages of the present disclosure will be more clearly understood from the following detailed description taken in conjunction with the accompanying drawings, in which.

DETAILED DESCRIPTION

Figure 1:
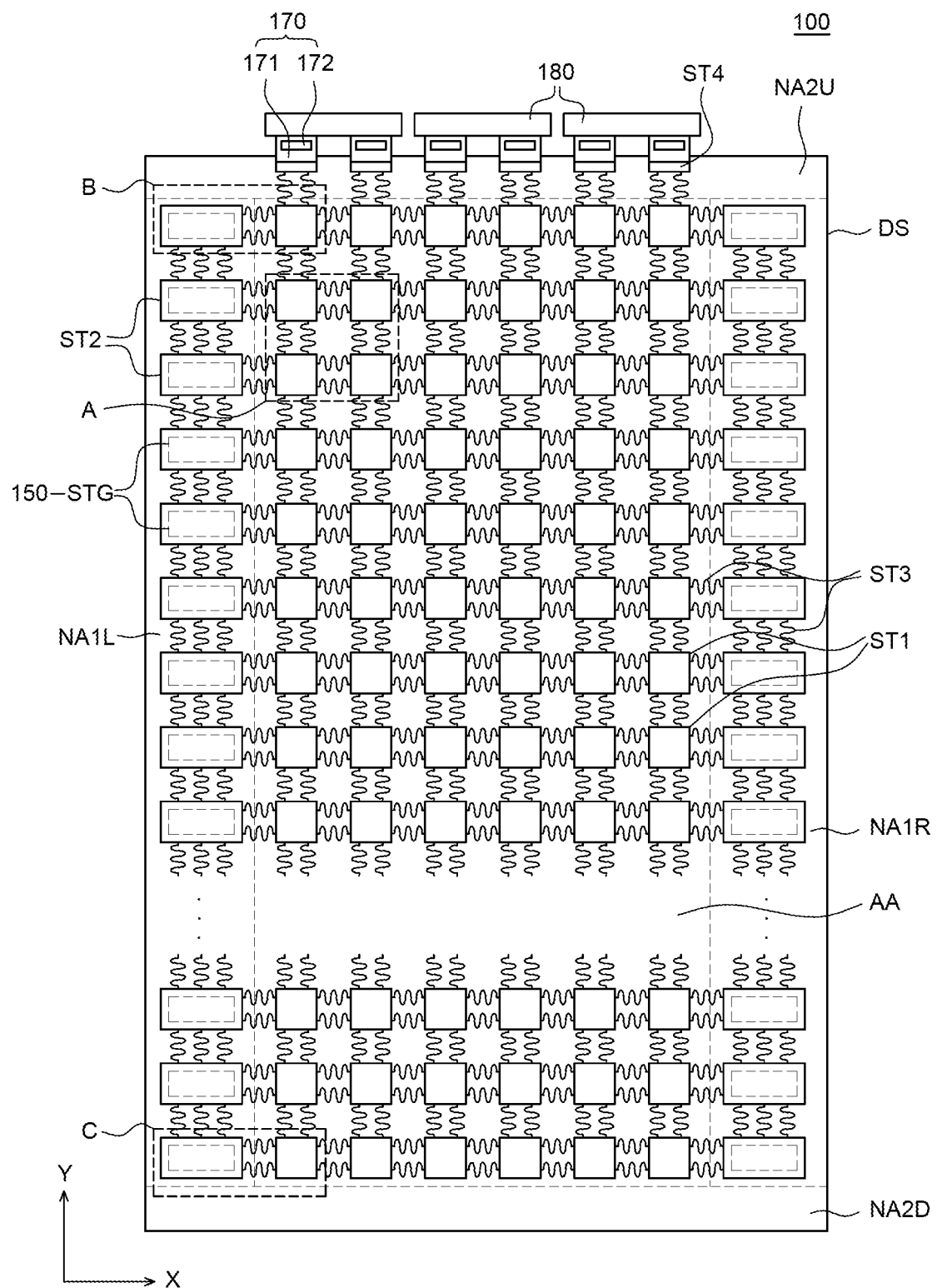
FIG. 1 is a schematic plan view of a stretchable display device according to embodiments of the present disclosure.

Advantages and characteristics of the present disclosure and a method of achieving the advantages and characteristics will be clear by referring to embodiments described below in detail together with the accompanying drawings. However, the present disclosure is not limited to the embodiments disclosed herein but will be implemented in various forms. The embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the embodiments of the present disclosure are merely examples, and the present disclosure is not limited thereto. Like reference numerals generally denote like elements throughout the specification. Further, in the following description of the present disclosure, a detailed explanation of known related technologies may be omitted to avoid unnecessarily obscuring the subject matter of the present disclosure. The terms such as "including," "having" used herein are generally intended to allow other components to be added unless the terms are used with the term "only." Any references to singular may include plural unless expressly stated otherwise.

Components are interpreted to include an ordinary error range even if not expressly stated.

When the position relation between two parts is described using the terms such as "on," "above," "below," and "next," one or more parts may be positioned between the two parts unless the terms are used with the term "immediately" or "directly."

When an element or layer is disposed "on" another element or layer, another layer or another element may be interposed directly on the other element or therebetween.

Although the terms "first," "second," and the like are used for describing various components, these components are not confined by these terms. These terms are merely used for distinguishing one component from the other components. Therefore, a first component to be mentioned below may be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

Stretchable Display Device

A stretchable display device may be referred to as a display device which is capable of displaying images even though the display device is bent or stretched. The stretchable display device may have a high flexibility as compared with a general display device of the related art. Therefore, a shape of a stretchable display device may be freely changed in accordance with manipulation of a user to bent or stretch a stretchable display device. For example, when the user holds ends of the stretchable display device to pull the stretchable display device, the stretchable display device may be stretched by the force of the user. Alternatively, when the user disposes the stretchable display device on a wall surface which is not flat, the stretchable display device may be disposed to be bent in accordance with the shape of the surface of the wall. Alternatively, when a force applied by the user is removed, the stretchable display device may return to its original shape.

FIG. 1 is a schematic plan view of a stretchable display device according to embodiments of the present disclosure. Referring to FIG. 1, a stretchable display device 100 includes a lower substrate DS, a plurality of first substrates ST1, a plurality of second substrates ST2, a plurality of connection substrates ST3, a plurality of dummy substrates ST4, a gate driver 150, a plurality of flexible films 170, and a printed circuit board 180. In FIG. 1, for the convenience of description, only some of the plurality of dummy substrates ST4 on which the plurality of flexible films 170 is bonded is illustrated.

The lower substrate DS is a substrate which supports and protects several components of the stretchable display device 100. The lower substrate DS which is a flexible substrate may be configured by an insulating material which is bendable or stretchable. For example, the lower substrate DS may be formed of a silicon rubber such as polydimethylsiloxane (PDMS) or an elastomer such as polyurethane (PU) or polytetrafluoroethylene (PTFE) and thus have a flexible property. However, the material of the lower substrate DS is not limited thereto.

The lower substrate DS is a flexible substrate so as to be reversibly expanded and contracted. Further, an elastic modulus of the lower substrate DS may be several MPa to several hundreds of MPa, for example, may be 0.7 MPa to 1 MPa. Further, an extension rupture rate of the lower substrate DS may be 100% or higher. Here, the extension rupture rate refers to an extension rate at a timing when an extended object is broken or cracked. A thickness of the lower substrate DS may be 10 μm to 1 mm, but is not limited thereto.

The lower substrate DS may have a display area AA and a non-display area NA adjacent to the display area AA.

Figure 2:
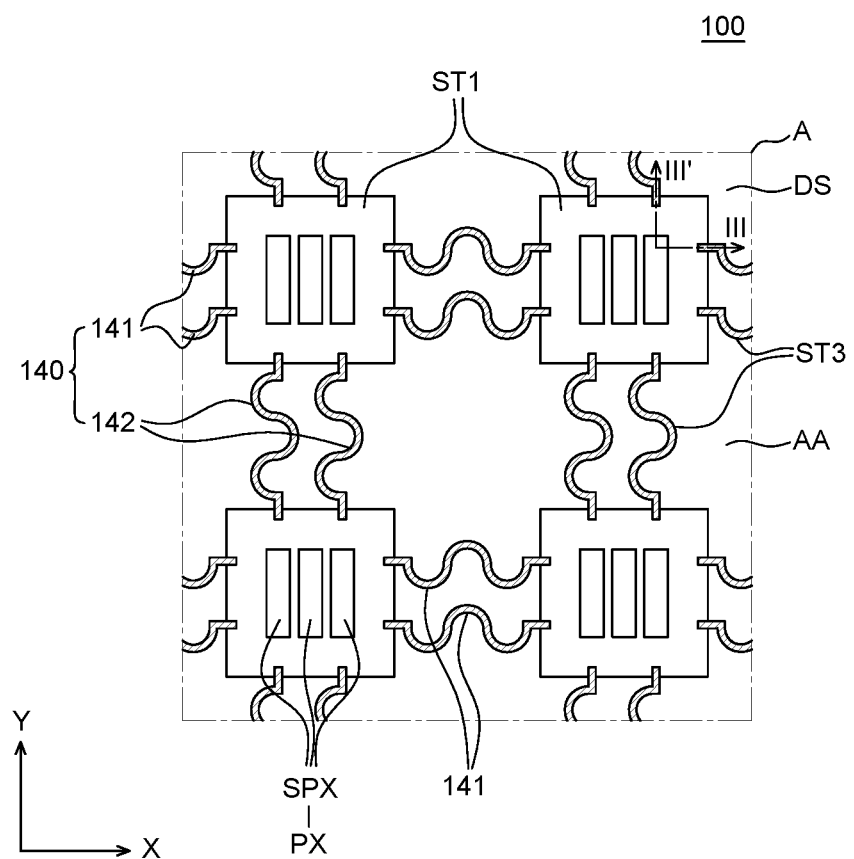
FIG. 2 is a schematic enlarged plan view of an A area of FIG. 1.

The display area AA is an area in which an image is displayed in the stretchable display device 100 and a display element and various driving elements for driving the display element are disposed in the display area AA. As illustrated in FIG. 2, the display area AA includes a plurality of pixels PX which includes a plurality of sub pixels SPX. The plurality of pixels PX is disposed in the display area AA and includes a plurality of display elements. The plurality of sub pixels SPX may be connected to various wiring lines, respectively. For example, the plurality of sub pixels SPX may be connected to various wiring lines such as a gate line, a data line, a high potential power source line, a low potential power source line, and a reference voltage line.

The non-display area NA is adjacent to the display area AA. The non-display area NA is adjacent to the display area AA. In some embodiments, the non-display area NA encloses the display area AA. In the non-display area NA, no image is displayed and wiring lines or circuit units may be disposed. For example, in the non-display area NA, a plurality of pads may be disposed and the pads may be connected to the plurality of sub pixels SPX of the display areas AA, respectively.

The non-display area NA includes a first non-display area NA1 and a second non-display area NA2.

The first non-display area NA1 is non-display areas NA at left and right sides of the display area AA and the plurality of second substrates ST2 is disposed therein.

The first non-display area NA1 includes a left non-display area NA1L and a right non-display area NA1R. The left non-display area NA1L is a non-display area at the left side of the display area AA and the right non-display area NA1R is a non-display area at the right side of the display area AA.

The second non-display area NA2 is non-display areas above and below the display area AA and the first non-display area NA1. The second non-display area NA2 is connected to the plurality of flexible films 170 and a clamp is disposed therein. Further, an inspection unit to be described below may be disposed therein.

The second non-display area NA2 includes an upper non-display area NA2U and a lower non-display area NA2D. The upper non-display area NA2U is a non-display area above the display area AA and the first non-display area NA1 and the lower non-display area NA2D is a non-display area below the display area AA and the first non-display area NA1. Further, the upper non-display area NA2U of the second non-display area NA2 may be connected to the plurality of flexible films 170. In the meantime, in FIG. 1, it is illustrated that the plurality of flexible films 170 is disposed in the upper non-display area NA2U, but is not limited thereto.

In the meantime, the first non-display area NA1 and the second non-display area NA2 are arbitrarily defined areas for more easy description of the area, but when the components are disposed as illustrated in FIG. 1, the definition of the first non-display area NA1 and the second non-display area NA2 may be changed.

The plurality of first substrates ST1 and the plurality of second substrates ST2 are disposed on the lower substrate DS. The plurality of first substrates ST1 may be disposed in the display area AA and the plurality of second substrates ST2 may be disposed in the first non-display area NA1.

The plurality of first substrates ST1 and the plurality of second substrates ST2 are rigid substrates and are spaced apart from each other to be independently disposed on the lower substrate DS. The plurality of first substrates ST1 and the plurality of second substrates ST2 may be more rigid than the lower substrate DS. That is, the lower substrate DS may have flexible properties more than the plurality of first substrates ST1 and the plurality of second substrates ST2 and the plurality of first substrates ST1 and the plurality of second substrates ST2 have rigid characteristic more than the lower substrate DS.

The plurality of first substrates ST1 and the plurality of second substrates ST2 which are rigid substrates may be formed of a plastic material having flexibility and for example, may be formed of polyimide (PI), polyacrylate, or polyacetate, but is not limited thereto. In this case, the plurality of first substrates ST1 and the plurality of second substrates ST2 may be formed of the same material, but are not limited thereto and may be formed of different materials.

Modulus of the plurality of first substrates ST1 and the plurality of second substrates ST2 may be higher than that of the lower substrate DS. The modulus is an elastic modulus indicating a rate of deformation by a stress, and the higher the modulus, the higher the hardness. Therefore, the plurality of first substrates ST1 and the plurality of second substrates ST2 may be a plurality of rigid substrates having larger rigidity as compared with the lower substrate DS. For example, the modulus of the plurality of first substrates ST1 and the plurality of second substrates ST2 may be 1000 times higher than the modulus of the lower substrate DS, but are not limited thereto.

In the meantime, the plurality of first substrates ST1 and the plurality of second substrates ST2 having rigid characteristic are disposed on the lower substrate DS so that a partial area of the lower substrate DS which overlaps the plurality of first substrates ST1 and the plurality of second substrates ST2 may be defined as an area having rigidity. Further, in the remaining area of the lower substrate DS which does not overlap the plurality of first substrates ST1 and the plurality of second substrates ST2, only the lower substrate DS is disposed so that the remaining area is defined as an area having flexibility. That is, areas where the plurality of first substrates ST1 and the plurality of second substrates ST2 are disposed may be defined as a plurality of rigid areas and an area where the plurality of first substrates ST1 and the plurality of second substrates ST2 are not disposed may be defined as a ductile area. In this case, the plurality of first substrates ST1 and the plurality of second substrates ST2 are disposed to be spaced apart from each other so that the plurality of rigid areas may be also disposed to be spaced apart from each other, and the ductile area may be disposed to enclose the plurality of rigid areas.

A plurality of pixels PX including a plurality of sub pixels SPX may be disposed on the plurality of first substrates ST1. In each of the plurality of sub pixels SPX of the plurality of first substrates ST1, a display element may be disposed and various lines such as a gate line, a data line, and a power line may be disposed. The plurality of sub pixels SPX will be described in more detail below with reference to FIGS. 2 and 3.

The gate driver 150 may be mounted on the plurality of second substrates ST2. The gate driver 150 may be disposed in the first non-display area NA1. The gate driver 150 may be formed on the second substrate ST2 in a gate in panel (GIP) manner when various components on the first substrate ST1 are manufactured. Therefore, various circuit configurations which configure the gate driver 150, such as various transistors, capacitors, and wiring lines may be disposed on the plurality of second substrates ST2. However, the gate driver 150 may be mounted in a chip on film (COF) manner, but is not limited thereto. Further, even though in FIG. 1, it is illustrated that the gate drivers 150 are disposed on both the left non-display area NA1L and the right non-display area NA1R, the gate driver may be disposed only on any one of the left non-display area NA1L and the right non-display area NA1R.

In the meantime, a size of the plurality of second substrates ST2 may be larger than a size of the plurality of first substrates ST1. As described above, on each of the plurality of second substrates ST2, the gate driver 150 is disposed. For example, one stage STG of the gate driver 150 may be disposed on each of the plurality of second substrates ST2. Therefore, an area occupied by various circuit configurations which configure one stage STG of the gate driver 150 may be relatively larger than an area of the first substrate ST1 on which the pixel PX is disposed. A size of each of the plurality of second substrates ST2 may be larger than a size of each of the plurality of first substrates ST1.

The plurality of connection substrates ST3 is disposed between the plurality of first substrates ST1 and the plurality of second substrates ST2. The plurality of connection substrates ST3 which connects the plurality of first substrates ST1 and the plurality of second substrates ST2 to each other is disposed between the plurality of first substrates ST1, between the plurality of second substrates ST2, and between the plurality of first substrates ST1 and the plurality of second substrates ST2. The plurality of connection substrates ST3 is substrates which connect adjacent first substrates ST1, adjacent second substrates ST2, and the first substrate ST1 and the second substrate ST3 which are adjacent to each other. The plurality of connection substrates ST3 may be integrally formed by being simultaneously formed with the same material as the plurality of first substrates ST1 and the plurality of second substrates ST2, but is not limited thereto.

The plurality of connection substrates ST3 may be formed with a curved shape on a flat surface. For example, the plurality of connection substrates ST3 may have a sine wave shape. However, the shape of the plurality of connection substrates ST3 is not limited thereto and the plurality of connection substrates ST3 may extend with a zigzag pattern or may be formed with various shapes such as a shape extended by connecting a plurality of rhombus-shaped substrates at vertices. Further, the number and the shape of the plurality of connection substrates ST3 are illustrative and the number and the shape of the plurality of connection substrates ST3 may vary depending on the design.

The plurality of flexible films 170 is a film in which various parts are disposed on a base film 171 having flexibility, and the plurality of flexible films 170 is a part to supply signals to the plurality of sub pixels SPX of the display area AA. The plurality of flexible films 170 may be bonded to the plurality of pads disposed in the non-display area NA. For example, one end of the plurality of flexible films 170 may be bonded to the upper non-display area NA2U of the second non-display area NA2.

Specifically, the plurality of flexible films 170 is not directly bonded on the lower substrate DS, but may be bonded on the plurality of dummy substrates ST4. The plurality of dummy substrates ST4 is disposed in the second non-display area NA2 so that a plurality of pads to which the plurality of flexible films 170 is bonded is formed. Further, in the plurality of dummy substrates ST4 to which the plurality of flexible films 170 is bonded, wiring lines which transmit signals from the plurality of flexible films 170 to the sub pixels of the plurality of first substrates ST1 and the gate driver 150 of the plurality of second substrates ST2 may be disposed. The plurality of dummy substrates ST4 will be described in more detail below with reference to FIGS. 4 to 6.

The plurality of flexible films 170 supplies a power voltage, a data voltage, and a gate signal to the plurality of sub pixels SPX of the display area AA through the pads. The plurality of flexible films 170 includes a base film 171 and a driving IC 172. Further, various parts may be additionally disposed on the flexible films 170. In the meantime, even though in FIG. 1, six flexible films 170 are illustrated, the number of the plurality of flexible films 170 is not limited thereto.

The base film 171 is a layer which supports the driving IC 172 of the plurality of flexible films 170. The base film 171 may be formed of an insulating material, and for example, may be formed of an insulating material having a flexibility.

The driving IC 172 is a part which processes data for displaying images and a driving signal for processing the data. In FIG. 1, even though it is illustrated that the driving IC 172 is mounted in a COF manner, the driving IC 172 may be mounted by a technique such as chip on glass (COG) or tape carrier package (TCP), but it is not limited thereto.

A controller such as an IC chip or a circuit unit may be mounted on the printed circuit board 180. Further, on the printed circuit board 180, a memory, a processor, or the like, may be mounted. The printed circuit board 180 is a component which transmits a signal for driving the display element to the display element. Even though in FIG. 1, it is described that three printed circuit boards 180 are used, the number of printed circuit boards 180 is not limited thereto.

In the meantime, even though not illustrated in FIG. 1, in the second non-display area NA2, an inspection circuitry for inspecting the gate driver 150 may be disposed. In some embodiments, the inspection circuitry (which may be referred to herein as an inspection unit) may include any electrical circuitry, features, components, an assembly of electronic components or the like configured to perform the various operations of the inspection unit as described herein. In some embodiments, the inspection unit may be included in or otherwise implemented by processing circuitry such as a microprocessor, microcontroller, integrated circuit, chip, microchip or the like. For example, the inspection unit is disposed in the upper non-display area NA2U and the lower non-display area NA2D of the second non-display area NA2 to transmit a gate signal output from the gate driver 150 to the plurality of flexible films 170 and the printed circuit board 180, or external equipment. By doing this, a defect of the gate driver 150 may be detected. The inspection unit will be described in more detail below with reference to FIGS. 4 to 6.

Hereinafter, the plurality of sub pixels SPX of the stretchable display device 100 according to embodiments of the present disclosure will be described in more detail with reference to FIGS. 2 and 3.

Planar and Cross-Sectional Structures

FIG. 2 is a schematic enlarged plan view of an A area of FIG. 1. FIG. 3 is a cross-sectional view taken along the line of FIG. 2.

Figure 3:
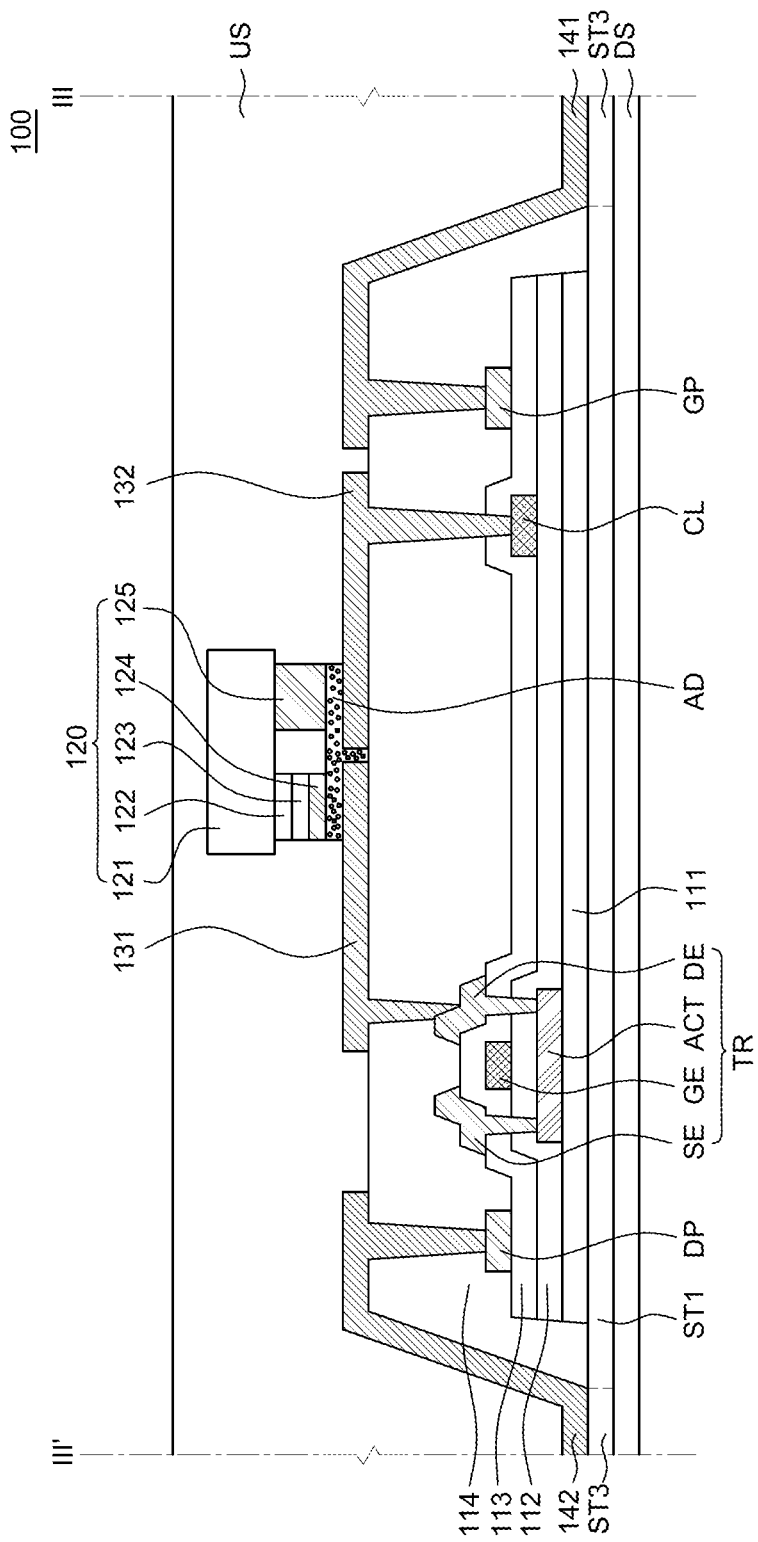
FIG. 3 is a cross-sectional view taken along the line of FIG. 2.

Referring to FIGS. 2 and 3, the plurality of first substrates ST1 is disposed on the lower substrate DS in the display area AA. As illustrated in FIG. 1, the plurality of first substrates ST1 may be disposed on the lower substrate DS in a matrix, but is not limited thereto.

A buffer layer 111 is disposed on the plurality of first substrates ST1. The buffer layer 111 is a layer for protecting various components of the stretchable display device 100 from permeation of moisture and oxygen from the outside of the lower substrate DS and the plurality of first substrates ST1 and may be formed on the plurality of first substrates ST1. The buffer layer 111 may be configured of an insulating material and for example, configured by a single layer or a double layer of an inorganic layer formed of silicon nitride (SiNx), silicon oxide (SiOx), and silicon oxynitride (SiON). However, the buffer layer 111 may be omitted depending on a structure or a characteristic of the stretchable display device 100.

In this case, the buffer layer 111 may be formed only in an area overlapping the plurality of first substrates ST1 and the plurality of second substrates ST2. As described above, the buffer layer 111 may be formed of an inorganic material so that the buffer layer 111 may be easily cracked or damaged during a process of stretching the stretchable display device 100. In this case, the buffer layer 111 is not formed in an area between the plurality of first substrates ST1 and the plurality of second substrates ST2, but is patterned to have a shape of the plurality of first substrates ST1 and the plurality of second substrates ST2 to be disposed only above the plurality of first substrates ST1 and the plurality of second substrates ST2. Therefore, in the stretchable display device 100 according to the embodiments of the present disclosure, the buffer layer 111 is formed only in an area overlapping the plurality of first substrates ST1 and the plurality of second substrates ST2 which are rigid substrates. Therefore, even though the stretchable display device 100 is bent or stretched to be deformed, the damage of the buffer layer 111 may be suppressed.

A transistor TR including an active layer ACT, a gate electrode GE, a source electrode SE, and a drain electrode DE is disposed on the buffer layer 111.

The active layer ACT is disposed on the buffer layer 111. For example, the active layer ACT may be formed of an oxide semiconductor, or amorphous silicon (a-Si), polycrystalline silicon (poly-Si), or an organic semiconductor.

A gate insulating layer 112 is disposed on the active layer ACT. The gate insulating layer 112 is a layer for electrically insulating the gate electrode GE from the active layer ACT and may be formed of an insulating material. For example, the gate insulating layer 112 may be formed as a single layer of silicon nitride (SiNx) or silicon oxide (SiOx) which is an inorganic material or a multiple layer of silicon nitride (SiNx) or silicon oxide (SiOx), but it is not limited thereto.

The gate electrode GE is disposed on the buffer layer 111. The gate electrode GE is disposed to overlap the active layer ACT. The gate electrode GE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

An interlayer insulating layer 113 is disposed on the gate electrode GE. The interlayer insulating layer is a layer which insulates the gate electrode GE from the source electrode SE and the drain electrode DE and is formed of an inorganic material, which is same as the buffer layer 111. For example, the interlayer insulating layer 113 may be formed as a single layer of silicon nitride (SiNx) or silicon oxide (SiOx) which is an inorganic material or a multiple layer of silicon nitride (SiNx) or silicon oxide (SiOx), but it is not limited thereto.

The source electrode SE and the drain electrode DE which are in contact with the active layer ACT are disposed on the interlayer insulating layer 113. The source electrode SE and the drain electrode DE are disposed on the same layer to be spaced apart from each other. The source electrode SE and the drain electrode DE may be in contact with the active layer ACT to be electrically connected to the active layer ACT. The source electrode SE and the drain electrode DE may be any one of various metal materials, for example, any one of molybdenum (Mo), aluminum (Al), chrome (Cr), gold (Au), titanium (Ti), nickel (Ni), neodymium (Nd), and copper (Cu) or an alloy of two or more of them, or a multiple layer thereof, but it is not limited thereto.

The gate insulating layer 112 and the interlayer insulating layer 113 are patterned to be formed only in an area overlapping the plurality of first substrates ST1. The gate insulating layer 112 and the interlayer insulating layer 113 are also formed of the inorganic material, which is the same as the buffer layer 111 so that the gate insulating layer 112 and the interlayer insulating layer 113 may also be easily cracked or be damaged during the process of stretching the stretchable display device 100. Therefore, the gate insulating layer 112 and the interlayer insulating layer 113 are not formed in an area between the plurality of first substrates ST1, but are patterned to have a shape of the plurality of first substrates ST1 to be formed only above the plurality of first substrates ST1.

Even though in FIG. 3, only a driving transistor among various transistors TR which may be included in the stretchable display device 100 is illustrated, a switching transistor, a capacitor, or the like, may also be included in the stretchable display device 100. Further, in the specification, even though it is described that the transistor TR has a coplanar structure, various transistors such as a staggered transistor may also be used.

The plurality of pads PE may be disposed on the interlayer insulating layer 113. In some embodiments, the plurality of pads PE include gate pads GP and data pads DP. For example, a gate pad GP among the plurality of pads PE may be disposed on the interlayer insulating layer 113. The gate pad GP is a pad which transmits a gate signal to the plurality of sub pixels SPX. The gate signal may be transmitted to the gate electrode GE through a gate line formed on the first substrate ST1 from the gate pad GP. The gate pad GP may be formed of the same material as the source electrode SE and the drain electrode DE, but is not limited thereto.

For example, a data pad DP among the plurality of pads PE may be disposed on the interlayer insulating layer 113. The data pad DP is a pad which transmits a data signal to the plurality of sub pixels SPX. The data signal may be transmitted to the source electrode SE or the drain electrode DE through a data line formed on the first substrate ST1 from the data pad DP. The data pad DP may be formed of the same material as the source electrode SE and the drain electrode DE, but is not limited thereto.

A planarization layer 114 is formed on the transistor TR and the interlayer insulating layer 113. The planarization layer 114 planarizes an upper portion of the transistor TR. The planarization layer 114 may be configured by a single layer or a plurality of layers and may be formed of an organic material. For example, the planarization layer 114 may be formed of an acrylic-based organic material, but is not limited thereto.

Referring to FIG. 3, the planarization layer 114 is disposed on the plurality of first substrates ST1 to cover top surfaces and side surfaces of the buffer layer 111, the gate insulating layer 112, and the interlayer insulating layer 113 to enclose the buffer layer 111, the gate insulating layer 112, and the interlayer insulating layer 113 together with the plurality of first substrates ST1. Specifically, the planarization layer 114 may be disposed so as to cover a top surface and a side surface of the interlayer insulating layer 113, a side surface of the gate insulating layer 112, a side surface of the buffer layer 111, and a part of a top surface of the plurality of first substrates ST1. Therefore, the planarization layer 114 may compensate for a step at the side surfaces of the buffer layer 111, the gate insulating layer 112, and the interlayer insulating layer 113 and enhance an adhesive strength of the planarization layer 114 and the connection line 140 disposed on the side surface of the planarization layer 114.

In some embodiments, a passivation layer may be formed between the transistor TR and the planarization layer 114. That is, the passivation layer may be formed to cover the transistor TR to protect the transistor TR from the permeation of the moisture and oxygen. The passivation layer may be formed of an inorganic material and configured by a single layer or a plurality of layers, but is not limited thereto.

A common line CL is disposed on the gate insulating layer 112. The common line CL is a wiring line which applies a common voltage to the plurality of sub pixels SPX. The common line CL may be formed of the same material as the gate electrode GE of the transistor TR, but is not limited thereto.

A plurality of connection lines 140 is disposed on the plurality of connection substrates ST3. The plurality of connection lines 140 is wiring lines which electrically connect the pads on the plurality of first substrates ST1 and the plurality of second substrates ST2.

The plurality of connection lines 140 includes a first connection line 141 and a second connection line 142. The first connection line 141 and the second connection line 142 are disposed between the plurality of first substrates ST1. Specifically, the first connection line 141 refers to a wiring line extending in an X-axis direction between the plurality of first substrates ST1 and the plurality of second substrates ST2 among the plurality of connection lines 140. The second connection line 142 refers to a wiring line extending in a Y-axis direction between the plurality of first substrates ST1 and the plurality of second substrates ST2 among the plurality of connection lines 140.

In the meantime, even though in FIG. 2, it is described that two connection lines 140 are disposed between the plurality of first substrates ST1 and the plurality of second substrates ST2, the number of connection lines 140 is not limited thereto.

The plurality of connection lines 140 may be formed of a metal material such as copper (Cu), aluminum (Al), titanium (Ti), and molybdenum or a stacked structure of metal materials such as copper/molybdenum-titanium (Cu/Moti) or titanium/aluminum/titanium (Ti/Al/Ti), but is not limited thereto.

For example, the connection lines 140 may be formed of a stacked structure of metal materials or may be formed of a base polymer in which conductive particles are dispersed to be disposed between the plurality of first substrates ST1 and the plurality of second substrates ST2 with a linear shape. The base polymer may be configured by an insulating material which is bent or stretched, similarly to the lower substrate DS. For example, the base polymer may include silicon rubber such as polydimethylsiloxane (PDMS), elastomer such as polyurethane (PU), or styrene butadiene styrene (SBS), but is not limited thereto. Therefore, when the stretchable display device 100 is bent or stretched, the base polymer may not be damaged.

The conductive particles may be dispersed in the base polymer. The conductive particles are dispersed in the base polymer to form a conductive path which electrically connects pads disposed in the first substrate ST1 and the second substrate ST2 which are adjacent to each other. The conductive particles may include at least one of silver (Ag), gold (Au), and carbon, but are not limited thereto.

In the meantime, in the case of a general display device, various wiring lines such as a plurality of gate lines and a plurality of data lines extend between the plurality of sub pixels with a linear shape and the plurality of sub pixels is connected to one signal line. Therefore, in the general display device, various wiring lines such as a gate line, a data line, a high potential power source line, and a reference voltage line extend from one side to the other side of the display device without being disconnected on the substrate.

In contrast, in the case of the stretchable display device 100 according to some embodiments of the present disclosure, various wiring lines formed of a metal material, such as the gate line, the data line, the power line, and the common line are disposed only on the plurality of first substrates ST1 and the plurality of second substrates ST2. That is, in the stretchable display device 100 according to some embodiments of the present disclosure, various wiring lines which are formed of a metal material and extend with a linear shape may be disposed only on the plurality of first substrates ST1 and the plurality of second substrates ST2. Therefore, various wiring lines are patterned so as to correspond to the plurality of first substrates ST1 and the plurality of second substrates ST2 to be discontinuously disposed.

In the stretchable display device 100 according to some embodiments of the present disclosure, in order to connect discontinuous wiring lines on the plurality of first substrates ST1 and the plurality of second substrates ST2, the plurality of connection lines 140 is disposed between the plurality of adjacent first substrates ST1, between the plurality of adjacent second substrates ST2, and between the plurality of first substrates ST1 and the plurality of second substrates ST2 which are adjacent to each other. The plurality of connection lines 140 electrically connects the pads which are adjacent to each other on the plurality of first substrates ST1 and the plurality of second substrates ST2. For example, the pads on the adjacent first substrates ST1, the adjacent second substrates ST2, or the first substrate ST1 and the second substrate ST2 which are adjacent to each other may be electrically connected by the plurality of connection lines 140. Accordingly, the stretchable display device 100 according to some embodiments of the present disclosure may include the plurality of connection lines 140 to electrically connect various wiring lines on the plurality of first substrates ST1 and the plurality of second substrates ST2 which are spaced apart from each other between the plurality of first substrates ST1, between the plurality of second substrates ST2, and between the plurality of first substrates ST1 and the plurality of second substrates ST2.

The first connection line 141 may connect pads on two first substrates ST1 which are disposed side by side among the pads on the plurality of first substrates ST1 which is disposed to be adjacent to each other in the X-axis direction. The first connection line 141 may serve as a gate line, an emission signal line, a high potential power source line, or a low potential power source line, but is not limited thereto. For example, the first connection line 141 may serve as a gate line and electrically connect the gate pads GP on two first substrates ST1 which are disposed side by side in the X-axis direction. Therefore, as described above, the gate pads GP on the plurality of first substrates ST1 disposed in the X-axis direction may be connected by the first connection line 141 serving as a gate line and transmit one gate signal.

Referring to FIG. 2, the second connection line 142 may connect pads on two first substrates ST1 which are disposed side by side among the pads on the plurality of first substrates ST1 which is disposed to be adjacent to each other in the Y-axis direction. The second connection line 142 may serve as a data line, a high potential power source line, a low potential power source line, or a reference voltage line, but is not limited thereto. For example, the second connection line 142 may serve as a data line and electrically connect the data lines on two first substrates ST1 which are disposed side by side in the Y-axis direction. Therefore, as described above, the data pads DP on the plurality of first substrates ST1 disposed in the Y-axis direction may be connected by the plurality of second connection lines 142 serving as data lines and transmit one data signal.

Referring to FIG. 3, the first connection pad 131 and the second connection pad 132 are disposed on the planarization layer 114. The first connection pad 131 is an electrode which electrically connects an LED 120 to be described below and the transistor TR. For example, the first connection pad 131 may electrically connect the drain electrode DE of the transistor TR and the LED 120 through a contact hole formed in the planarization layer 114.

The second connection pad 132 is an electrode which electrically connects the LED 120 and the common line CL. For example, the second connection pad 132 may electrically connect the common electrode and the LED 120 through the contact hole formed in the planarization layer 114.

The LED 120 which is an inorganic light emitting diode is disposed on the first connection pad 131 and the second connection pad 132, as a display element. The LED 120 may be transferred onto the first substrate ST1 through a transferring process. The LED 120 may include an n-type layer 121, an active layer 122, a p-type layer 123, an n electrode 124, and a p electrode 125. Hereinafter, it is assumed that the LED 120 of the stretchable display device 100 according to some embodiments of the present disclosure has a flip-chip structure in which the n electrode 124 and the p electrode 125 are formed on one surface. However, the LED 120 may be formed with a vertical structure or a horizontal structure, and is not limited thereto.

The n-type layer 121 may be formed by injecting an n-type impurity into gallium nitride (GaN). The n-type layer 121 may be disposed on a separate base substrate which is formed of a material which is capable of emitting light.

The active layer 122 is disposed on the n-type layer 121. The active layer 122 is a light emitting layer which emits light in the LED 120 and may be formed of a nitride semiconductor, for example, indium gallium nitride (InGaN). The p-type layer 123 is disposed on the active layer 122. The p-type layer 123 may be formed by injecting a p-type impurity into gallium nitride (GaN).

As described above, the LED 120 according to some embodiments of the present disclosure may be manufactured by sequentially laminating the n-type layer 121, the active layer 122, and the p-type layer 123, and then etching a predetermined part to form the n electrode 124 and the p electrode 125. In this case, the predetermined part is a space for separating the n electrode 124 and the p electrode 125 from each other and the predetermined part may be etched to expose a part of the n-type layer 121. In other words, the surfaces of the LED 120 to dispose the n electrode 124 and the p electrode 125 are not flat surfaces, but have different heights.

As described above, in the etched area, in other words, on the n-type layer 121 exposed by the etching process, the n electrode 124 is disposed. The n electrode 124 may be formed of a conductive material. In the meantime, in an area which is not etched, in other words, on the p-type layer 123, the p electrode 125 is disposed. The p electrode 125 is also formed of a conductive material, for example, may be formed of the same material as the n electrode 124.

The adhesive layer AD is disposed between the first connection pad 131 and the p electrode 125 and between the second connection pad 132 and the n electrode 124 to attach the LED 120 onto the first connection pad 131 and the second connection pad 132.

The adhesive layer AD may be a conductive adhesive layer AD in which conductive balls are dispersed in an insulating base member. When heat or pressure is applied to the adhesive layer AD, the conductive balls are electrically connected in a portion applied with heat or pressure to have a conductive property and an area which is not pressurized may have an insulating property. For example, the n electrode 124 is electrically connected to the second connection line 142 by means of the adhesive layer AD and the p electrode 125 is electrically connected to the first connection line 141 by means of the adhesive layer AD. That is, after applying the adhesive layer AD on the first connection pad 131 and the second connection pad 132 using an inkjet method, the LED 120 is transferred onto the adhesive layer AD and the LED 120 is pressurized or applied with heat. By doing this, the first connection pad 131 is electrically connected to the p electrode 125 and the second connection pad 132 is electrically connected to the n electrode 124. However, another part of the adhesive layer AD excluding a part of the adhesive layer AD disposed between the n electrode 124 and the second connection pad 132 and a part of the adhesive layer AD disposed between the p electrode 125 and the first connection pad 131 has an insulating property. In the meantime, the adhesive layer AD may be separated to be disposed on the first connection pad 131 and the second connection pad 132, respectively.

As described above, the stretchable display device 100 according to some embodiments of the present disclosure has a structure in which the LED 120 is disposed on the first substrate ST1 on which the transistor TR is disposed. Therefore, when the stretchable display device 100 is turned on, different voltage levels which are applied to the first connection pad 131 and the second connection pad 132 are transmitted to the n electrode 124 and the p electrode 125 so that the LED 120 may emit light.

In the meantime, even though not illustrated in the drawing, a bank may be further formed on the planarization layer 114. The bank may be disposed between adjacent sub pixels SPX to reduce or minimize the color mixture phenomenon caused by light which is emitted from the LED 120 of one sub pixel SPX and transmitted to an adjacent sub pixel SPX. For example, the bank is disposed so as to cover at least a part of the first connection pad 131 and the second connection pad 132 and is spaced apart from the LED 120. The bank may be formed of an insulating material such as acrylic-based resin, benzocyclobutene (BCB)-based resin or polyimide, but is not limited thereto. Further, the bank may further include a black material, for example, further include carbon black, but is not limited thereto.

The upper substrate US is disposed so as to cover the plurality of first substrates ST1 and the connection substrate ST3 on the lower substrate DS. The upper substrate US is a substrate which supports various components disposed below the upper substrate US. Specifically, the upper substrate US may be formed by coating and curing a material which configures the upper substrate US on the lower substrate DS and the plurality of first substrates ST1.

The upper substrate US which is a flexible substrate may be configured by an insulating material which is bendable, pliable, or stretchable. The upper substrate US is a flexible substrate so as to be reversibly expanded and contracted. Further, an elastic modulus of the upper substrate US may be several MPa to several hundreds of MPa, for example, may be 0.7 MPa to 1 MPa. Further, an extension rupture rate of the upper substrate US may be 100% or higher. A thickness of the upper substrate US may be 10 μm to 1 mm, but is not limited thereto.

The upper substrate US may be formed of the same material as the lower substrate DS. For example, the upper substrate US may be formed of a material having a flexibility, for example, be formed of a silicon rubber such as polydimethylsiloxane (PDMS) or an elastomer such as polyurethane (PU) or polytetrafluoroethylene (PTFE), but is not limited thereto.

In the meantime, even though not illustrated in the drawing, a polarization layer may be further disposed on the upper substrate US. The polarization layer may perform a function which polarizes light incident from the outside of the stretchable display device 100 to reduce the external light reflection. Further, an optical film other than the polarization layer may be disposed on the upper substrate US.

The stretchable display device 100 needs to have a property which is easily bendable and stretchable, so that there is an attempt to use a substrate which has a small modulus to have a flexible property. However, when a flexible material such as polydimethylsiloxane (PDMS) having a small modulus is used as a lower substrate to be disposed while manufacturing a display element, there is a problem in that the substrate is damaged due to a high temperature generated during the process of forming a transistor TR and a display element, for example, a temperature of 100° C. or higher due to a characteristic of the material having a small modulus which is vulnerable to the heat.

Therefore, it is possible to suppress the damage of the substrate during the process of forming a display element by forming the display element above a substrate formed of a material which is tolerable to the high temperature. Therefore, there is an attempt to form the substrate using a material which is tolerable to the high temperature generated during the manufacturing process, such as polyimide (PI). However, since the materials which are tolerable to the high temperature have a large modulus, there is a problem in that the materials do not have a flexible property so that the substrate is hardly bent or stretched during the process of stretching the stretchable display device 100.

Accordingly, in the stretchable display device 100 according to some embodiments of the present disclosure, the plurality of first substrates ST1 and the plurality of second substrates ST2 which are rigid substrates are disposed only in an area where the transistor TR is disposed. By doing this, the plurality of first substrates ST1 and the plurality of second substrates ST2 are not damaged by the high temperature during the manufacturing process of the transistor TR.

Further, in the stretchable display device 100 according to some embodiments of the present disclosure, the lower substrate DS and the upper substrate US which are flexible substrates may be disposed below and above the plurality of first substrates ST1 and the plurality of second substrates ST2. Therefore, the remaining area of the lower substrate DS and the upper substrate US excluding the area overlapping the plurality of first substrates ST1 and the plurality of second substrates ST2 may be easily stretched or bent, so that the stretchable display device 100 may be implemented. Further, the transistor TR, the LED 120, and the gate driver 150 disposed above the plurality of first substrates ST1 and the plurality of second substrates ST2 which are rigid substrates may be suppressed from being damaged as the stretchable display device 100 is bent or stretched.

In the meantime, the gate driver 150 disposed on the plurality of second substrates ST2 outputs a gate signal to the plurality of connection lines 140 under the control of the timing controller to select a sub pixel SPX to which the data voltage is charged and control an emission timing. For example, a plurality of clock signals, a gate low voltage, a gate high voltage, and a gate start signal may be input to the plurality of stages STG of the gate driver 150. Further, the plurality of stages STG may supply the gate signal to the plurality of connection lines 140 while shifting a gate start signal to a next stage STG in accordance with a plurality of clock signals.

For example, among the plurality of stages STG, a first stage STG at an uppermost side which is the most adjacent to the plurality of flexible film 170 receives a gate start signal to output a gate signal to the plurality of sub pixels SPX in a first row. Further, a second stage STG receives a gate signal output from the first stage STG as a start signal to output the gate signal to the plurality of sub pixels SPX in a second row. That is, the gate signals output from the plurality of stages STG are supplied to the plurality of sub pixels SPX and may operate stages STG in a next row, simultaneously.

When a defect is generated in the gate driver 150, it may be difficult to drive the plurality of sub pixels SPX. Therefore, an inspection structure which detects a defect of the gate driver 150 needs to be provided in the stretchable display device 100.

However, in order to dispose a circuit which detects whether the gate driver 150 has a defect in the stretchable display device 100, a plurality of rigid substrates and a connection line 140 with a curved shape need to be further disposed. That is, in order to form a circuit which detects a defect of the gate driver 150 in the stretchable display device 100, an additional rigid substrate and the connection line 140 need to be disposed. However, many substrates such as the first substrates ST1, the second substrates ST2, and the connection substrates ST3 are already disposed on the lower substrate DS and a mechanism which stretches the stretchable display device 100, such as a clamp, needs to be disposed. Therefore, it may be difficult to ensure an area for forming the additional rigid substrate and the connection line 140 which form a defect detecting circuit.

Therefore, the stretchable display device 100 according to some embodiments of the present disclosure forms an inspection unit with reduced size or minimum size which is configured by a simplified configuration to easily detect the defect of the gate driver 150. Specifically, each of the plurality of stages STG operates a gate signal output in a previous stage STG as a start signal so that when a defect is caused in a middle stage STG among the plurality of stages STG, the stages may not properly operate from the middle stage STG to the last stage STG. For example, when a defect is generated in a third stage STG among the plurality of stages STG, the start signal, that is, the gate signal may not be properly supplied from the third stage STG to the last stage STG which is the lowermost stage. Further, the plurality of sub pixels SPX corresponding to the stages STG may not normally operate. Therefore, when gate signals output from the uppermost stage which receives the gate start signal to operate first and the lowermost stage which operates at the last, among the plurality of stages STG of the gate driver 150, are inspected, it is possible to easily inspect whether the gate driver 150 is defective.

Hereinafter, an inspection unit of a stretchable display device 100 according to embodiments of the present disclosure will be described in more detail with reference to FIGS. 4 to 6.

Inspection Unit

Figure 4:
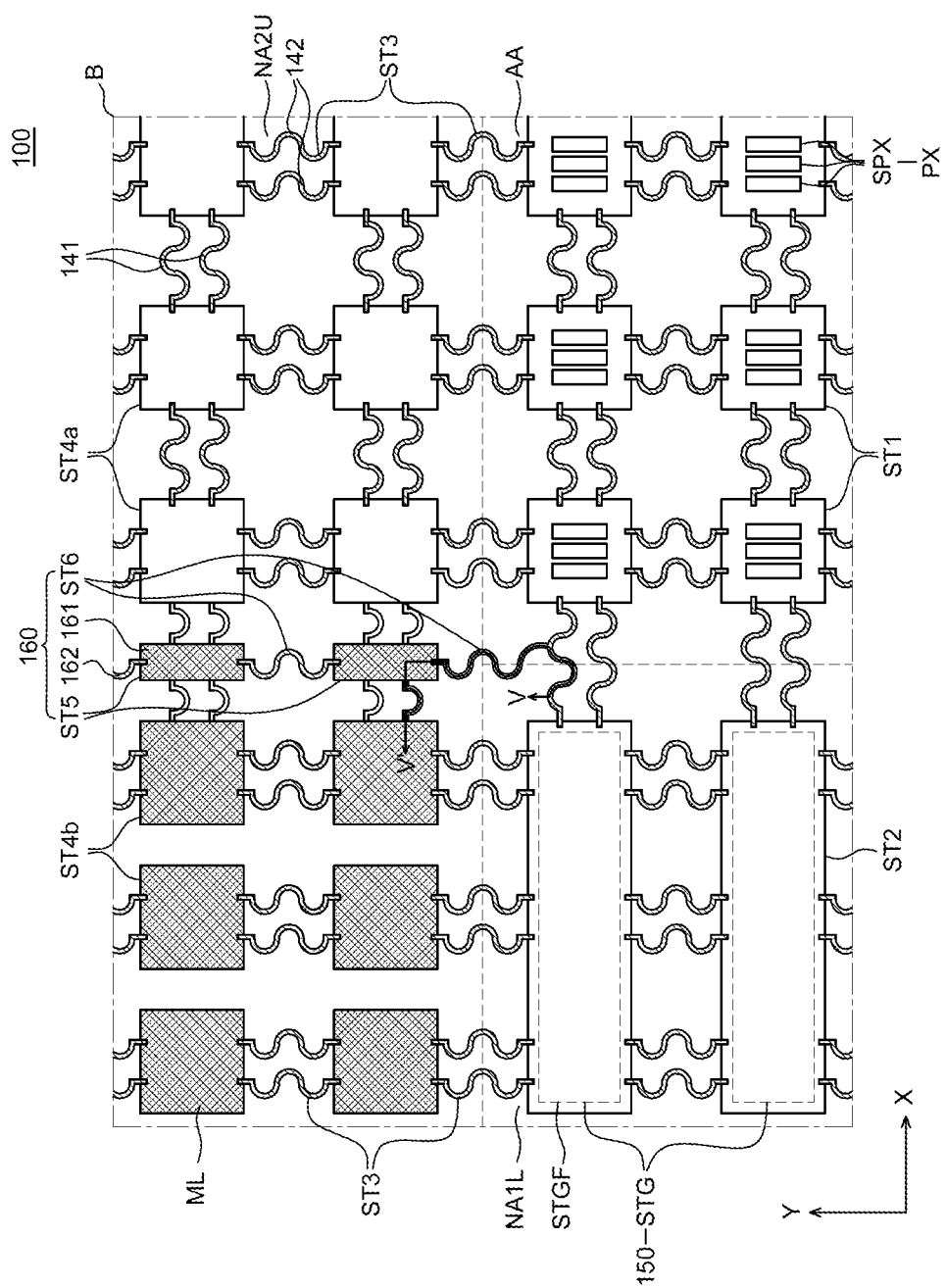
FIG. 4 is a schematic enlarged plan view of a B area of FIG. 1.

FIG. 4 is a schematic enlarged plan view of a B area of FIG. 1. FIG. 5 is a cross-sectional view taken along the line V-V' of FIG. 4. FIG. 6 is a schematic enlarged plan view of a C area of FIG. 1. Referring to FIGS. 4 to 6, the stretchable display device 100 according to some embodiments of the present disclosure further includes a plurality of dummy substrates ST4, a plurality of metal layers ML, and an inspection unit 160. The inspection unit 160 includes a plurality of inspection substrates ST5, a plurality of inspection patterns 161, a plurality of additional connection substrates ST6, a plurality of additional connection lines 162, a pad substrate ST7, and an inspection pad 163.

Figure 5:
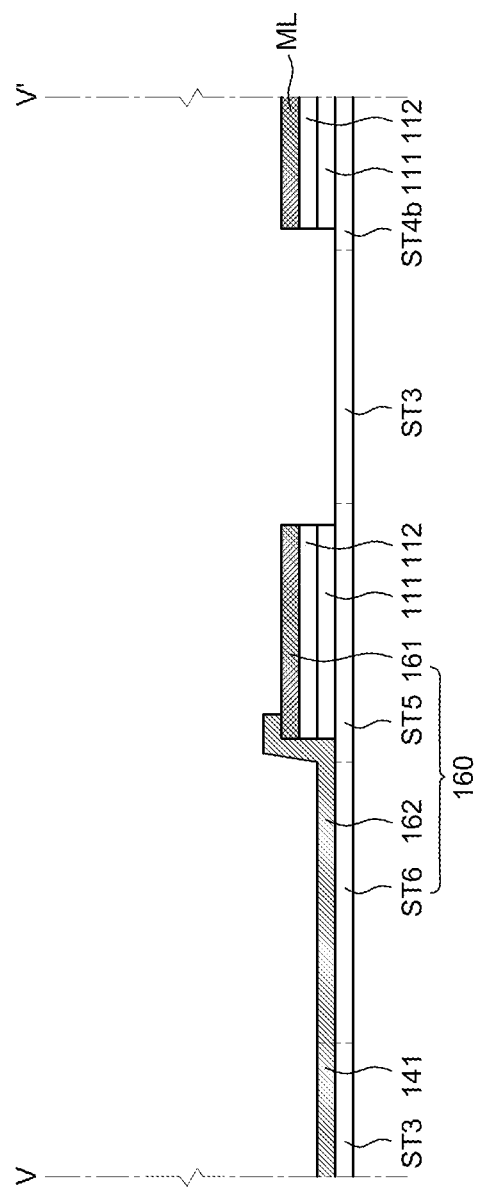
FIG. 5 is a cross-sectional view taken along the line V-V' of FIG. 4.

Referring to FIGS. 4 and 5, the plurality of dummy substrates ST4 is disposed in the second non-display area NA2. The plurality of dummy substrates ST4 disposed in the upper non-display area NA2U may be disposed between the plurality of flexible films 170 whose one end is disposed in the upper non-display area NA2U and the plurality of first substrates ST1 and the plurality of second substrates ST2. On the plurality of dummy substrates ST4, wiring lines which transmit signals from the plurality of flexible films 170 to the sub pixels SPX of the plurality of first substrates ST1 and the gate driver 150 of the plurality of second substrates ST2 are disposed. The plurality of dummy substrates ST4 may be formed with the same material as the plurality of first substrates ST1 and the plurality of second substrates ST2, but is not limited thereto.

The plurality of dummy substrates ST4 includes a first dummy substrate ST4a and a second dummy substrate ST4b. On the first dummy substrate ST4a, wiring lines which are disposed on and below the display area AA to transmit signals from the printed circuit board 180 and the plurality of flexible films 170 to the plurality of first substrates ST1 are disposed. Therefore, when the components of the plurality of first substrates ST1 are manufactured, a plurality of wiring lines and pads may also be formed on the plurality of first dummy substrates ST4a. For example, on the plurality of first dummy substrates ST4a, at least some of components excluding the LED 120 of the plurality of first substrates ST1 may be formed. On the plurality of first dummy substrates ST4a, a transistor TR, a gate pad GP, and a data pad DP which are the same as those formed on the plurality of first substrates ST1 may be formed.

Among the plurality of first dummy substrates ST4a on which the transistor TR, the gate pad GP, and the data pad DP are formed, the plurality of connection substrates ST3 may be disposed between the first dummy substrates ST4a which are adjacent to each other in a vertical direction. Further, the plurality of connection substrates ST3 may be disposed between the first dummy substrates ST4a which are adjacent to each other in a horizontal direction. That is, the plurality of connection substrates ST3 may connect the plurality of first dummy substrates ST4a, similarly to the plurality of first substrates ST1.

On the plurality of second dummy substrate ST4b, wiring lines which are disposed on and below the first non-display area NA1 to transmit signals from the printed circuit board 180 and the plurality of flexible films 170 to the plurality of second substrates ST2 are disposed.

In the meantime, as described above, the plurality of stages STG of the gate driver 150 mounted in the plurality of second substrates ST2 may receive a plurality of clock signals, a gate low voltage, a gate high voltage, and a gate start signal to supply the gate signal to the plurality of first substrates ST1. In this case, the metal layers ML disposed on the second dummy substrates ST4b in the same column, among the plurality of second dummy substrates ST4b, may serve as a wiring line which transmits one of the plurality of clock signals, the gate low voltage, the gate high voltage, and the gate start signal to the gate driver 150.

The plurality of connection substrates ST3 may connect second dummy substrates ST4b which are adjacent to each other in the vertical direction, among the plurality of second dummy substrates ST4b. The metal layer ML on the second dummy substrates ST4b which are disposed in the same column and the connection line 140 on the connection substrate ST3 may serve as one wiring line.

In this case, one signal is transmitted to the metal layer ML on the second dummy substrate ST4b disposed in the same column and the connection line 140 so that even though only one connection substrate ST3 and connection line 140 are disposed between the second dummy substrate ST4b, the metal layer ML and the connection line 140 may serve as one wiring line. However, as illustrated in FIG. 4, when the plurality of connection substrates ST3 and the connection line 140 are disposed between the second dummy substrates ST4b, the overall area of the connection line 140 may be increased so that it may be advantageous in terms of a resistance.

In the meantime, the plurality of connection substrates ST3 may not connect second dummy substrates ST4b which are adjacent to each other in the horizontal direction, among the plurality of second dummy substrates ST4b. If the second dummy substrates ST4b which are adjacent to each other in the horizontal direction are connected, signals which are transmitted to the gate driver 150 through the metal layer ML on the second dummy substrates ST4b disposed in the same column may interfere with each other. Therefore, the connection substrate ST3 may not be disposed between the second dummy substrates ST4b which are adjacent to each other in the horizontal direction.

In FIG. 4, it is described that the plurality of connection substrates ST3 connects the plurality of first dummy substrates ST4a and connects only the second dummy substrates ST4b which are adjacent to each other in the vertical direction among the plurality of second dummy substrates ST4b. However, the plurality of connection substrates ST3 may be selectively disposed between the plurality of dummy substrates ST4 depending on an interval between the plurality of dummy substrates ST4 and a type of signal transmitted through the plurality of dummy substrates ST4, but is not limited thereto.

In the meantime, even though not illustrated in the drawing, in the second non-display area NA2 in which the plurality of dummy substrates ST4, a clamp may be disposed. The clamp is mechanical equipment which is disposed on both sides of the display area AA to allow a user to stretch the stretchable display device 100 when the stretchable display device 100 is stretched and may serve as a handle. For example, clamps may be disposed in the second non-display areas NA2 above and below the display area AA and the user may use the clamp to stretch the stretchable display device 100 in a Y-axis direction.

Referring to FIGS. 4 and 5, the inspection unit 160 is disposed in the second non-display area NA2. The inspection unit 160 disposed in the upper non-display area NA2U inspects a gate signal output from the uppermost stage STGF among the plurality of stages STG.

The inspection unit 160 includes a plurality of inspection substrates ST5, a plurality of additional connection substrates ST6, a plurality of inspection patterns 161, and a plurality of additional connection lines 162.

The plurality of inspection substrates ST5 is disposed in the second non-display area NA2. On the plurality of inspection substrates ST5 disposed in the upper non-display area NA2U, the inspection patterns 161 which transmit a first gate signal output from the uppermost stage STGF, that is, the first stage STG, to the plurality of flexible films 170 and the printed circuit board 180 are disposed. The plurality of inspection substrates ST5 may be formed of the same material as the plurality of first substrates ST1 and the plurality of second substrates ST2, but is not limited thereto. The inspection pattern 161 may be described below with reference to FIG. 5.

The plurality of inspection substrates ST5 is disposed between the plurality of dummy substrates ST4. For example, the plurality of inspection substrates ST5 may be disposed along the Y-axis direction between the plurality of first dummy substrates ST4a and the plurality of second dummy substrates ST4b. For example, the plurality of inspection substrates ST5 may be disposed above the connection line 140 which connects the uppermost stage STGF and the first substrate ST1, among the plurality of connection lines 140 extending in the X-axis direction.

The plurality of additional connection substrates ST6 is disposed between the plurality of inspection substrates ST5. The plurality of additional connection substrates ST6 connects a connection substrate ST3 which extends from the second substrate ST2 on which the uppermost stage STGF is formed toward the first substrate ST1 and the inspection substrate ST5 and connects the inspection substrates ST5 which are adjacent to each other in the vertical direction. Specifically, one end of the additional connection substrate ST6 is connected to the connection line 140 which extends from the second substrate ST2 on which the uppermost stage STGF is formed toward the first substrate ST1 in the X-axis direction. The other end of the additional connection substrate ST6 is connected to an inspection substrate ST5 which is the most adjacent to the display area AA and the first non-display area NA1. Further, the plurality of additional connection substrates ST6 may connect the plurality of inspection substrates ST5 disposed along the Y-axis direction. That is, the plurality of additional connection substrates ST6 may connect the inspection substrates ST5 which are adjacent to each other in the vertical direction, among the plurality of inspection substrates ST5.

In the meantime, even though not illustrated in FIG. 4, the plurality of inspection substrates ST5 and the plurality of additional connection substrates ST6 disposed in the upper non-display area NA2U may extend toward the plurality of flexible films 170 whose one ends are disposed in the upper non-display area NA2U. The plurality of inspection substrates ST5 and the plurality of additional connection substrates ST6 of the upper non-display area NA2U may be disposed to connect the plurality of flexible films 170 and the second substrate ST2 on which the uppermost stage STGF is disposed. Accordingly, the gate signal output from the uppermost stage STGF may be transmitted not only to the first substrate ST1, but also to the plurality of flexible films 170 and the printed circuit board 180 through the inspection pattern 161 formed on the plurality of inspection substrates ST5 to be described below and the additional connection line 162 formed on the plurality of additional connection substrates ST6.

In the meantime, the connection substrate ST3 may be disposed between the plurality of inspection substrates ST5 and the plurality of first dummy substrates ST4a and the plurality of second dummy substrates ST4b disposed on left and right sides of the plurality of inspection substrates ST5. That is, the plurality of connection substrates ST3 may connect between the plurality of inspection substrates ST5 and the plurality of first dummy substrates ST4a and the plurality of second dummy substrates ST4b adjacent to the left and right sides of the plurality of inspection substrates ST5. However, the connection substrates ST3 which connect the plurality of inspection substrates ST5 and the plurality of first dummy substrates ST4a and the plurality of inspection substrates ST5 and the plurality of second dummy substrates ST4b may be omitted depending on a design, and are not limited thereto.

Referring to FIG. 5, the additional connection line 162 is disposed on the additional connection substrate ST6. The additional connection line 162 may be electrically connected to the connection line 140 to which a first gate signal output from the uppermost stage STGF is transmitted. Further, the additional connection line 162 may transmit the gate signal output from the uppermost stage STGF to the plurality of inspection patterns 161 on the plurality of inspection substrates ST5. The additional connection line 162 may be formed of the same material as the connection line 140 by the same process, but is not limited thereto.

The inspection patterns 161 are disposed in the plurality of inspection substrates ST5. The plurality of inspection patterns 161 may be electrically connected to the plurality of additional connection lines 162. The plurality of inspection patterns 161 may serve as a wiring line which transmits a gate signal from the uppermost stage STGF together with the plurality of additional connection lines 162. Accordingly, the plurality of inspection patterns 161 and the plurality of additional connection lines 162 may be electrically connected to the connection line 140 which transmits a gate signal output from the uppermost stage STGF. The plurality of inspection patterns 161 and the plurality of additional connection lines 162 may transmit the gate signal from the uppermost stage STGF to the plurality of flexible films 170 and the printed circuit board 180 and detect a defect of the gate driver 150.

In the meantime, one or more insulating layers may be disposed on the plurality of inspection substrates ST5. For example, the buffer layer 111 and the gate insulating layer 112 may be sequentially formed on the plurality of inspection substrates ST5.

First, the plurality of inspection patterns 161 may be formed on the plurality of inspection substrates ST5 together when various components on the plurality of first substrates ST1 are manufactured. For example, the plurality of inspection patterns 161 may be formed of the same material as the transistor TR and the plurality of pads by the same process. In this case, when the plurality of inspection patterns 161 is formed of the same material as the gate electrode GE by the same process, as formed on the first substrate ST1, one or more insulating layer may also be formed between the plurality of inspection patterns 161 and the plurality of inspection substrates ST5. For example, as described above with reference to FIG. 3, after forming the buffer layer 111 and the gate insulating layer 112 on the first substrate ST1, the gate electrode GE may be formed on the gate insulating layer 112. Further, after forming the buffer layer 111 and the gate insulating layer 112 on the plurality of inspection substrates ST5, the inspection pattern 161 formed of the same material as the gate electrode GE may be formed on the gate insulating layer 112. However, the buffer layer 111, the gate insulating layer 112, and the inspection pattern 161 disposed on the plurality of inspection substrates ST5 are illustrative. Therefore, the plurality of inspection patterns 161 may be directly formed on the plurality of inspection substrates ST5 without disposing the insulating layers such as the buffer layer 111 and the gate insulating layer 112.

Further, materials which form the inspection pattern 161 may vary depending on the design.

In the meantime, the plurality of inspection patterns 161 is patterned so as to correspond to a planar shape of each of the plurality of inspection substrates ST5 to be formed on the plurality of inspection substrates ST5. For example, when the plurality of inspection substrates ST5 has a rectangular shape, the plurality of inspection patterns 161 is also patterned to have a rectangular shape. In this case, as the plurality of inspection patterns 161 is patterned to have a shape of the plurality of inspection substrates ST5, areas of the plurality of inspection patterns 161 may be ensured on the plurality of inspection substrates ST5 as much as possible. Further, as the areas of the plurality of inspection patterns 161 are ensured, it may be advantageous in terms of the resistance. However, the shape of the plurality of inspection patterns 161 may be different from the planar shape of the plurality of inspection substrates ST5 and is not limited thereto.

The metal layer ML is disposed in at least some of the plurality of dummy substrates ST4. For example, the metal layer ML may be disposed on the second dummy substrate ST4b of the plurality of dummy substrates ST4. The metal layer ML may serve as a wiring line which transmits signals from the printed circuit board 180 and the plurality of flexible films 170 to the gate driver 150 of the plurality of second substrates ST2 together with the plurality of connection lines 140.

In the meantime, in FIGS. 4 and 5, it has been described that on the plurality of first dummy substrates ST4a, the transistor TR, the gate pad GP, and the data pad DP, as formed on the first substrate ST1, are formed and on the second dummy substrates ST4b, the metal layer ML is formed. However, components which are same as formed on the first substrate ST1 or the second substrate ST2 may be formed on the plurality of second dummy substrates ST4b or the metal layer ML may be formed on the plurality of first dummy substrates ST4a, but are not limited thereto.

The metal layer ML may be formed on the plurality of second dummy substrates ST4b together when various components on the first substrate ST1 are manufactured, but is not limited thereto.

Further, like the inspection substrate ST5, on the plurality of second dummy substrates ST4b, one or more insulating layers are disposed. Like the plurality of inspection patterns 161, the metal layer ML may also be formed on the plurality of second dummy substrates ST4b together when various components on the plurality of first substrates ST1 are manufactured. For example, when the metal layer ML is formed of the same material as the gate electrode GE by the same process, the buffer layer 111 and the gate insulating layer 112 are sequentially formed on the plurality of second dummy substrates ST4b and the plurality of first substrates ST1. Next, the metal layer ML is formed on the gate insulating layer 112 formed on the plurality of second dummy substrates ST4b and the gate electrode GE is formed on the gate insulating layer 112 formed on the plurality of first substrates ST1, simultaneously. However, the buffer layer 111 and the gate insulating layer 112, and the metal layer ML disposed on the plurality of second dummy substrates ST4b are illustrative. Therefore, the plurality of metal layers ML may be directly disposed on the plurality of second dummy substrates ST4b without having the insulating layers such as the buffer layer 111 and the gate insulating layer 112. Further, the material of the metal layers ML may also vary depending on the design.

In the meantime, the connection substrate ST3 is disposed between the dummy substrate ST4 and the inspection substrate ST5 which are adjacent in the horizontal direction, but the connection line 140 may not be disposed. If the connection line 140 is disposed on the connection substrate ST3 which connects the first dummy substrate ST4a and the inspection substrate ST5 or the second dummy substrate ST4b and the inspection substrate ST5, components on the gate driver 150 and the plurality of metal layers ML or the gate driver 150 and the first dummy substrate ST4a are electrically connected through the plurality of additional connection lines 162, the plurality of inspection patterns 161, and the connection line 140 so that the stretchable display device 100 may be damaged. Therefore, only the connection substrate ST3 is disposed between the inspection substrate ST5 and the first dummy substrate ST4a and between the inspection substrate ST5 and the second dummy substrate ST4b, but the connection line 140 may not be disposed for the purpose of electrical insulation.

Figure 6:
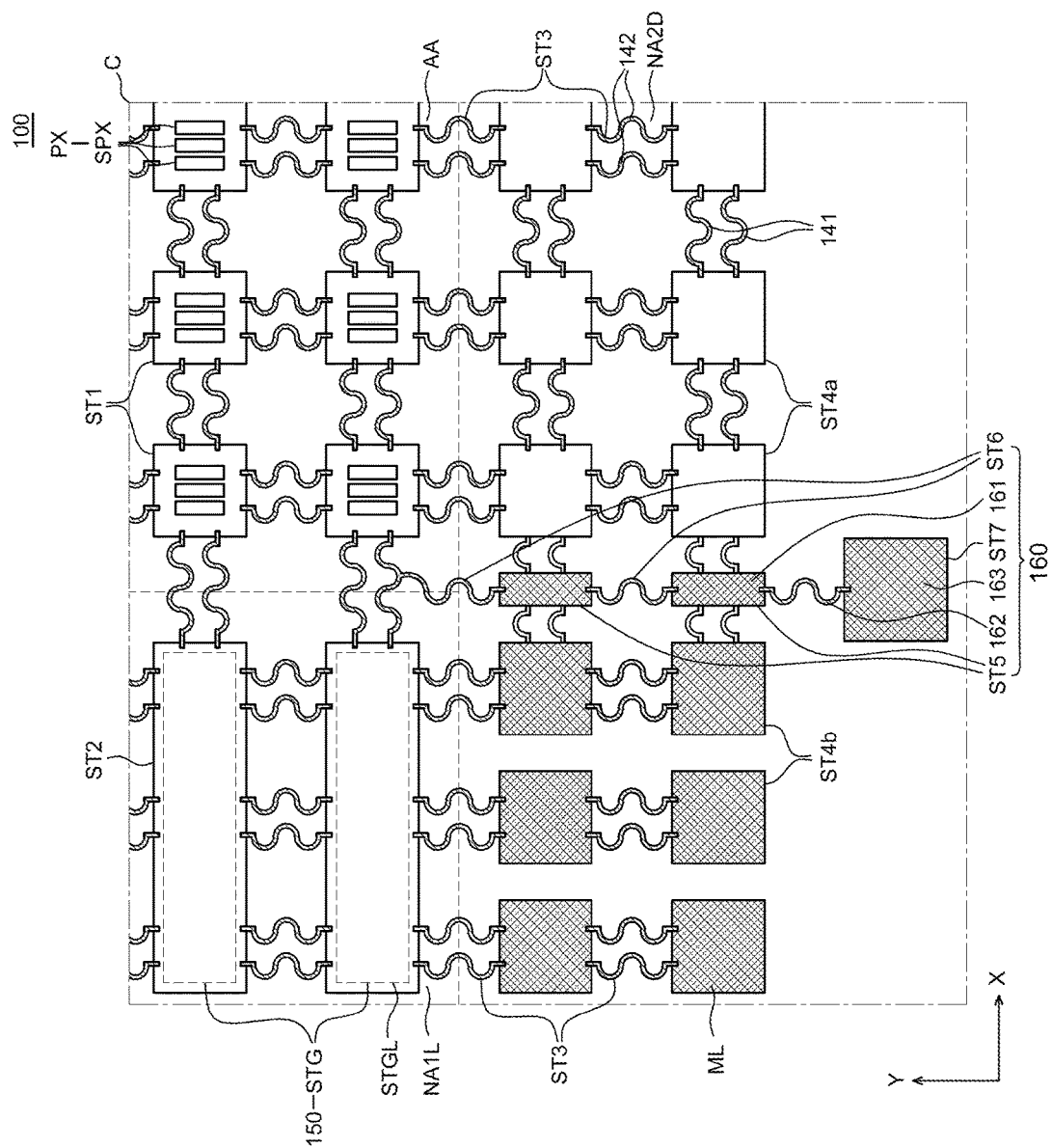
FIG. 6 is a schematic enlarged plan view of a C area of FIG. 1.

Next, referring to FIGS. 4 and 6, the plurality of dummy substrates ST4 is also disposed in the lower non-display area NA2D of the second non-display area NA2. The plurality of dummy substrates ST4 disposed in the lower non-display area NA2D may uniformly stretch the stretchable display device 100 together with the plurality of dummy substrates ST4 disposed in the upper non-display area NA2U.

Specifically, the plurality of dummy substrates ST4 is disposed in the second non-display area NA2 to uniformly stretch the stretchable display device 100 and reduce or minimize the damage of the stretchable display device 100. If the plurality of dummy substrates ST4 is not disposed in the second non-display area NA2, the second non-display area NA2 may be a ductile area having flexibility. In this case, when the stretchable display device 100 is stretched, the second non-display area NA2 may be stretched more than the display area AA and the first non-display area NA1 in which the plurality of first substrates ST1 and the plurality of second substrates ST2 are disposed. That is, as the second non-display area NA2 is stretched more, the connection line 140 and the connection substrate ST3 disposed in the second non-display area NA2 may be damaged or the stress may be concentrated onto the first substrate ST1 and the second substrate ST2 adjacent to the second non-display area NA2. Accordingly, in the stretchable display device 100 according to some embodiments of the present disclosure, the plurality of dummy substrates ST4 is disposed also in the second non-display area NA2 so as to correspond to the display area AA and the first non-display area NA1. By doing this, the stretchable display device 100 may be uniformly stretched. That is, the plurality of first substrates ST1, the plurality of second substrates ST2, and the plurality of dummy substrates ST4 with similar sizes are disposed on the lower substrate DS with a uniform interval. Therefore, the stretchable display device 100 may be more uniformly stretched and the stress concentrated onto any one portion of the stretchable display device 100 or damage of the connection substrate ST3 and the connection line 140 may be reduced or minimized.

Referring to FIG. 6 again, the inspection unit 160 is disposed in the lower non-display area NA2D. The inspection unit 160 disposed in the lower non-display area NA2D inspects a gate signal output from the lowermost stage STGL among the plurality of stages STG.

On the plurality of inspection substrates ST5 disposed in the lower non-display area NA2D, inspection patterns 161 which transmit a last gate signal output from the lowermost stage STGL, that is, the last stage STG to external equipment are disposed.

Additional connection substrates ST6 are disposed between the plurality of inspection substrates ST5 disposed in the lower inspection area NA2D. The plurality of additional connection substrates ST6 connects a connection substrate ST3 which extends from the second substrate ST2 on which the lowermost stage STGL is formed toward the first substrate ST1 and the inspection substrate ST5 and connects the inspection substrates ST5 which are adjacent to each other in the vertical direction. Specifically, one end of the additional connection substrate ST6 is connected to the connection line 140 which extends from the second substrate ST2 on which the lowermost stage STGL is formed toward the first substrate ST1 in the X-axis direction. The other end of the additional connection substrate ST6 is connected to an inspection substrate ST5 which is the most adjacent to the display area AA and the first non-display area NA1. Further, the plurality of additional connection substrates ST6 may connect the plurality of inspection substrates ST5 disposed along the Y-axis direction.

In the meantime, the pad substrate ST7 is disposed in the lower non-display area NA2D. The pad substrate ST7 may be connected to the plurality of inspection substrates ST5 and the plurality of additional connection substrates ST6. The plurality of inspection substrates ST5 and the plurality of additional connection substrates ST6 of the lower non-display area NA2D may be disposed to connect the second substrate ST2 on which the lowermost stage STGL is disposed and the pad substrate ST7.

The inspection pad 163 is disposed on the pad substrate ST7. The inspection pad 163 may be electrically connected to the additional connection line 162 on the plurality of additional connection substrates ST6 and the inspection pattern 161 on the plurality of inspection substrates ST5. Therefore, the gate signal output from the lowermost stage STGL may be transmitted to the inspection pad 163 through the plurality of additional connection lines 162 and the plurality of inspection patterns 161.

In the meantime, in order to transmit the gate signal output from the lowermost stage STGL adjacent to the lower non-display area NA2D to the plurality of flexible films 170 of the upper non-display area NA2U, an additional connection line 140 and a rigid substrate need to be disposed. However, it may be difficult to dispose the plurality of connection lines 140 and the rigid substrate which intersect the first non-display area NA1 or the display area AA in a limited area.

Therefore, the gate signal of the lowermost stage STGL transmitted to the inspection pad 163 may be transmitted to the external equipment which is electrically connected to the inspection pad 163 to detect the defect of the gate driver 150. For example, a probe of the external equipment is in contact with the inspection pad 163 to inspect the gate signal output from the lowermost stage STGL. Therefore, the stretchable display device 100 according to some embodiments of the present disclosure detects the gate signal output from the uppermost stage STGF and the gate signal output from the lowermost stage STGL to detect the defect of the gate driver 150 formed by a plurality of stages STG which operates using a gate signal output from the previous stage STG as a start signal.

In the meantime, in FIGS. 4 and 5, it has been described that the gate signal output from the uppermost stage STGF is transmitted to the plurality of flexible films 170 through the inspection unit 160. However, the gate signal output from the uppermost stage STGF is transmitted to a separate inspection pad 163 as disposed in the lower non-display area NA2D to inspect the gate signal of the uppermost stage STGF in the external equipment, but is not limited thereto.

Therefore, the stretchable display device 100 according to some embodiments of the present disclosure disposes an inspection unit with a reduced size or minimized size to easily detect the defect of the gate driver 150. First, the gate driver 150 is configured by a plurality of stages STG. Each of the plurality of stages STG operates with a gate signal output from the previous stage STG as a start signal. Therefore, even though only the gate signal output from the uppermost stage STGF and the gate signal output from the lowermost stage STGL are inspected, it is possible to easily check whether the gate driver 150 is defective. Accordingly, the stretchable display device 100 according to some embodiments of the present disclosure disposes the inspection unit 160 which is electrically connected to the uppermost stage STGF and the lowermost stage STGL to inspect whether the gate driver 150 is defective. Specifically, the plurality of inspection substrate ST5 and the plurality of additional connection substrates ST6 may be disposed between the second substrate ST2 on which the uppermost stage STGF is formed and the plurality of flexible films 170. Further, the connection line 140 to which the gate signal output from the uppermost stage STGF is transmitted and the additional connection line 162 of the inspection unit 160 and the inspection pattern 161 may be electrically connected. Therefore, the gate signal output from the uppermost stage STGF is transmitted to the plurality of flexible films 170 through the additional connection line 162 and the inspection pattern 161 to easily detect the defect of the gate driver 150. Similarly, the plurality of inspection substrate ST5 and the plurality of additional connection substrates ST6 may be connected to the second substrate ST2 on which the lowermost stage STGL is formed. However, in order to transmit the gate signal output from the lowermost stage STGL adjacent to the lower non-display area NA2D to the plurality of flexible films 170 of the upper non-display area NA2U, an additional connection line 162 and a rigid substrate need to be disposed. Therefore, the gate signal output from the lowermost stage STGL is transmitted to the inspection pad 163 disposed in the lowermost non-display area NA2D and the inspection pad 163 transmits the gate signal to the external equipment to easily detect the defect of the gate driver 150. Accordingly, in the stretchable display device 100 according to some embodiments of the present disclosure, instead of the inspection unit 160 configured by a complex circuit, the inspection unit 160 serves as a wiring line which transmits only the output signals of the uppermost stage STGF and the lowermost stage STGL to the plurality of flexible films 170 and the external equipment. Therefore, the configuration of the inspection unit 160 may be simplified. As a result, the inspection unit 160 which has a reduced area or minimum area is formed in the stretchable display device 100 to easily detect the defect of the gate driver 150.

Figure 7:
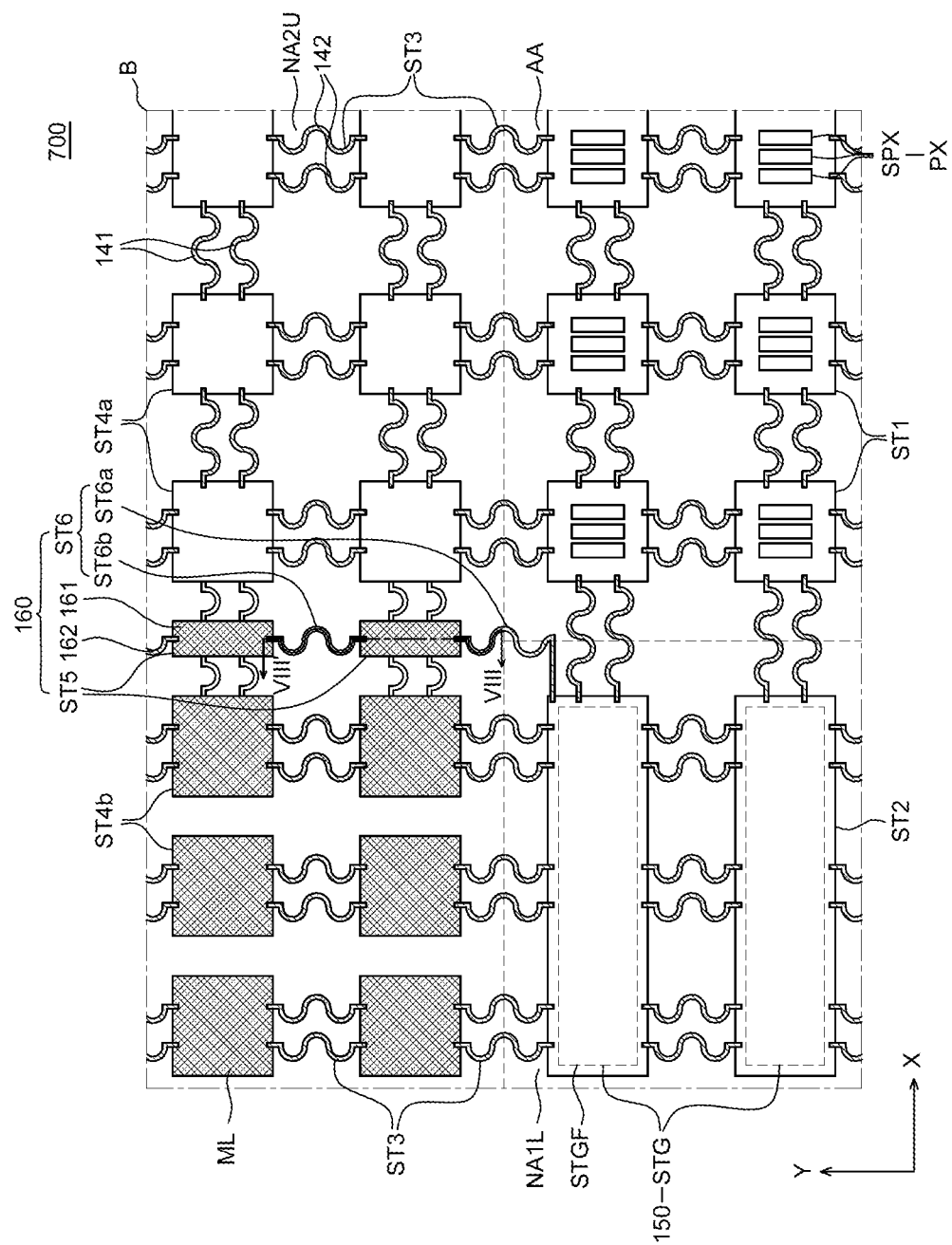
FIG. 7 is a schematic enlarged plan view of a B area of a stretchable display device according to another embodiment of the present disclosure.
Figure 8:
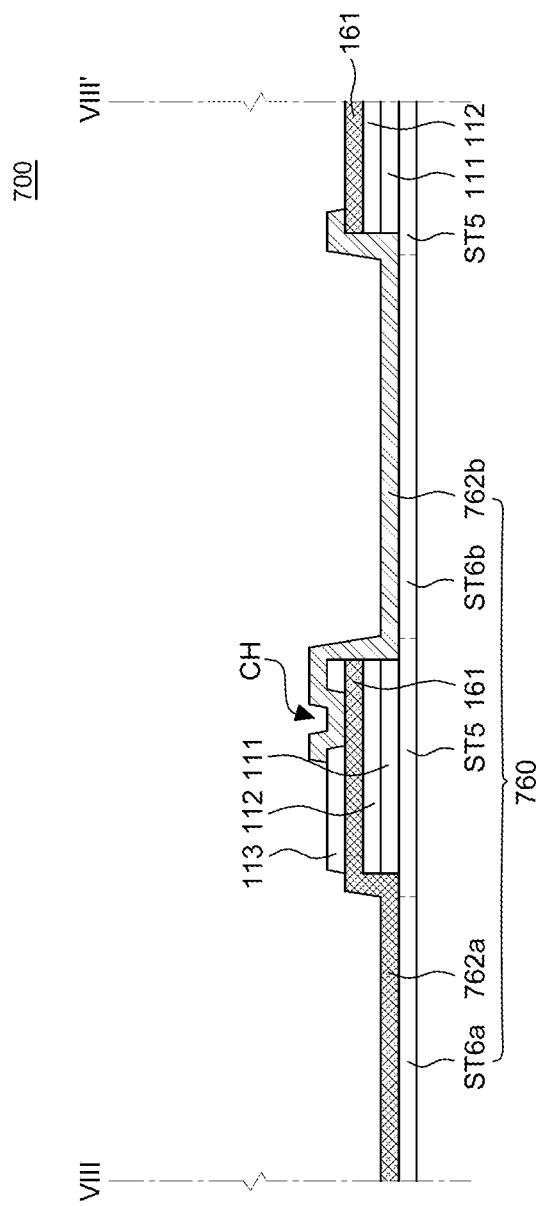
FIG. 8 is a cross-sectional view taken along the line VIII-VIII' of FIG. 7.

FIG. 7 is a schematic enlarged plan view of a B area of a stretchable display device according to another embodiment of the present disclosure. FIG. 8 is a cross-sectional view taken along the line VIII-VIII' of FIG. 7. As compared with the stretchable display device of FIGS. 1 to 6, in a stretchable display device 700 of FIGS. 7 and 8, the additional connection substrate ST6 and the additional connection line 162 are different and a plurality of insulating layers is further included. However, the other configuration is substantially the same, so that a redundant description will be omitted.

Referring to FIG. 7, the plurality of additional connection substrates ST6 includes a first additional connection substrate ST6a and a second additional connection substrate ST6b.

The first additional connection substrate ST6a connects a second substrate ST2 which is the most adjacent to the second non-display area NA2 and the inspection substrate ST5. The first additional connection substrate ST6a connects the second substrates ST2 on which the uppermost stage STGF and the lowermost stage STGL are formed, respectively, to the inspection substrate ST5. For example, the first additional connection substrate ST6a may connect the inspection substrate ST5 which is the most adjacent to the uppermost second substrate ST2 on which the uppermost stage STGF is formed to the uppermost second substrate ST2. For example, even though not illustrated in the drawing, in the lower non-display area NA2D, the first additional connection substrate ST6a may connect the inspection substrate ST5 which is the most adjacent to the lowermost second substrate ST2 on which the lowermost stage STGL is formed to the lowermost second substrate ST2.

In the meantime, a part of the first additional connection substrate ST6a extends along the X-axis direction with a linear shape and the remaining part of the first additional connection substrate ST6a extends along the Y-axis direction with a curved shape. For example, as described above, the second non-display area NA2 above and below the display area AA may be an area where a clamp is disposed. In this case, the stretchable display device 700 may be stretched in the Y-axis direction by a user who pulls the clamp. In this case, an external force may be applied to the components in the stretchable display device 700 such as the connection line 140 and the connection substrate ST3 to be stretched along the Y-axis direction. In this case, since the part of the first additional connection substrate ST6a which extends with a linear shape is disposed along the X-axis direction, even though the stretchable display device 700 is stretched in the Y-axis direction, the part may not be easily cracked. In contrast, since the remaining part of the first additional connection substrate ST6a disposed along the Y-axis direction is formed with a curved, when the stretchable display device 700 is stretched in the Y-axis direction, the remaining part may be flexibly changed instead of being damaged by the external force.

However, in FIG. 7, it has been described that a part of the first additional connection substrate ST6a has a linear shape, but the entire first additional connection substrate ST6a may be formed with a curved shape along the stretching direction of the stretchable display device 700, and is not limited thereto.

The second additional connection substrate ST6b connects inspection substrates ST5 which are adjacent to each other, among the plurality of inspection substrates ST5. The second additional connection substrate ST6b connects inspection substrates ST5 which are adjacent to each other in the vertical direction, among the plurality of inspection substrates ST5. The second additional connection substrate ST6b connects the plurality of inspection substrates ST5. For example, the second additional connection substrate ST6b may connect the inspection substrate ST5 connected to the second substrate ST2 on which the uppermost stage STGF is formed through the first additional connection substrate ST6a to the remaining inspection substrate ST5. For example, even though not illustrated in the drawing, the second additional connection substrate ST6b may connect the inspection substrate ST5 connected to the second substrate ST2 on which the lowermost stage STGL is formed through the first additional connection substrate ST6a to the remaining inspection substrate ST5.

Referring to FIG. 8, the first additional connection line 762a is disposed on the first additional connection substrate ST6a and the second additional connection line 762b is disposed on the second additional connection substrate ST6b. The first additional connection line 762a and the second additional connection line 762b may be formed on the plurality of additional connection substrates ST6 together when various components on the plurality of first substrates ST1 are manufactured. In this case, the first additional connection line 762a and the second additional connection line 762b may be formed together with different components or formed together with the same components.

For example, the first additional connection line 762a and the inspection pattern 161 may be formed of the same material as the gate electrode GE by the same process and the second additional connection line 762b may be formed of the same material as the source electrode SE and the drain electrode DE by the same process. In this case, an interlayer insulating layer 113 may be formed between the first additional connection line 762a and the inspection pattern 161 and the second additional connection line 762b as the same as the interlayer insulating layer 113 is formed between the gate electrode GE and the source electrode SE and the drain electrode DE on the first substrate ST1.

First, as described in detail above with reference to FIG. 3, after forming the buffer layer 111 and the gate insulating layer 112 on the first substrate ST1, the gate electrode GE is formed on the gate insulating layer 112. Therefore, after forming the buffer layer 111 and the gate insulating layer 112 on the plurality of inspection substrates ST5, the inspection pattern 161 which is formed of the same material as the gate electrode GE may be formed on the gate insulating layer 112. In this case, since the first additional connection line 762a may be formed of the same material as the inspection pattern 161 by the same process, the first additional connection line 762a is integrally formed with the inspection pattern 161 to be formed on the first additional connection substrate ST6a.

Further, after forming the interlayer insulating layer 113 which covers the gate electrode GE on the first substrate ST1, the source electrode SE and the drain electrode DE are formed on the interlayer insulating layer 113. Therefore, the interlayer insulating layer 113 may be formed on the plurality of inspection substrates ST5 to cover the inspection pattern 161 which is formed of the same material as the gate electrode GE. Alternatively, after forming the interlayer insulating layer 113, the second additional connection line 762b formed of the same material as the source electrode SE and the drain electrode DE may be formed on the plurality of the second additional connection substrates ST6b. That is, the first additional connection line 762a and the inspection pattern 161 may be formed with the second additional connection line 762b and the interlayer insulating layer 113 therebetween.

In this case, a contact hole CH may be formed in the interlayer insulating layer 113 to electrically connect the first additional connection line 762a and the inspection pattern 161 to the second additional connection line 762b. An edge of the second additional connection line 762b may be electrically connected to the inspection pattern 161 through the contact hole CH formed in the interlayer insulating layer 113. Therefore, the first additional connection line 762a, the second additional connection line 762b, and the inspection pattern 161 of the inspection unit 760 are formed of the same material by the same process, but may be formed of different materials by different processes. Further, even though an insulating layer is formed between the first additional connection line 762a, the second additional connection line 762b, and the inspection pattern 161, a contact hole CH is formed in the insulating layer to electrically connect the first additional connection line 762a, the second additional connection line 762b, and the inspection pattern 161 to each other.

The stretchable display device 700 according to another embodiment of the present disclosure directly connects the additional connection substrate ST6 and the additional connection line 162 to the second substrate ST2 to simplify the structure of the inspection unit 760. Specifically, the first additional connection substrate ST6a is connected to the second substrate ST2 on which the uppermost stage STGF is formed and the uppermost stage STGF is electrically connected to the first additional connection line 762a to receive the gate signal output from the uppermost stage STGF. Further, the first additional connection substrate ST6a is connected to the second substrate ST2 on which the lowermost stage STGL is formed and the lowermost stage STGL is electrically connected to the first additional connection line 762a to receive the gate signal output from the lowermost stage STGL. Therefore, the gate signal output from the uppermost stage STGF and the lowermost stage STGL may be transmitted to the plurality of flexible films 170 or the inspection pad 163 and the external equipment through the first additional connection line 762a, the inspection pattern 161, and the second additional connection line 762b of the inspection unit 760. Accordingly, in the stretchable display device 700 according to another embodiment of the present disclosure, the inspection unit 760 is directly connected to the uppermost stage STGF and the lowermost stage STGL to simplify the structure of the inspection unit 760.

Figure 9:
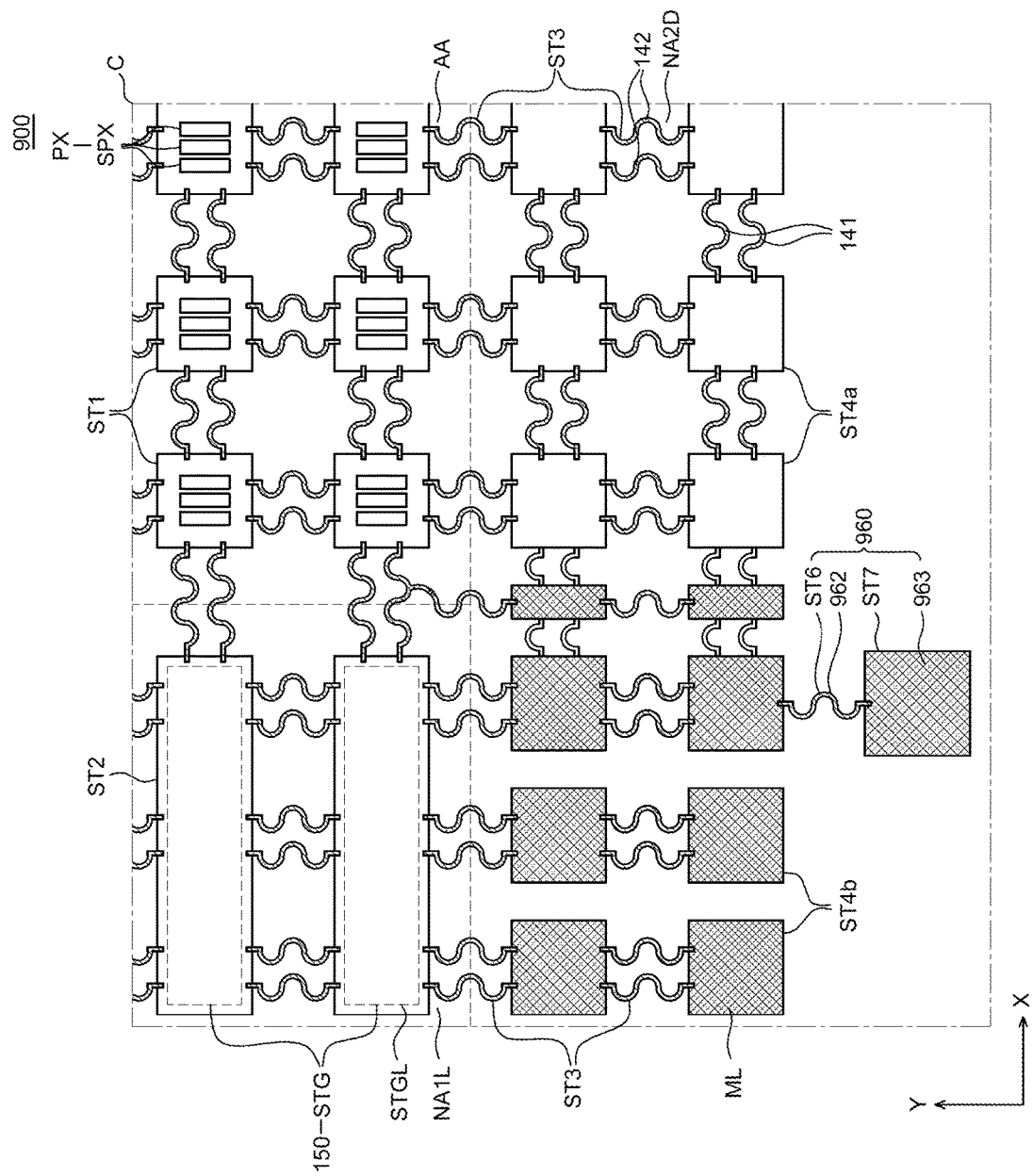
FIG. 9 is a schematic enlarged plan view of a C area of a stretchable display device according to still another embodiment of the present disclosure.

FIG. 9 is a schematic enlarged plan view of a C area of a stretchable display device according to still another embodiment of the present disclosure. As compared with the stretchable display device 100 of FIGS. 1 to 6, in a stretchable display device 900 of FIG. 9, an inspection unit 960 of a lower non-display area NA2D includes only a pad substrate ST7, an inspection pattern 161, an additional connection substrate ST6, and an additional connection line 962. However, the other configuration is substantially the same, so that a redundant description will be omitted.

Referring to FIG. 9, the pad substrate ST7 is disposed in the lower non-display area NA2D. The pad substrate ST7 may be connected to a second dummy substrate ST4b among the plurality of dummy substrates ST4 by the additional connection substrate ST6. In this case, a metal layer ML of the second dummy substrate ST4b to which the pad substrate ST7 is connected is a metal layer ML to which a gate signal output from the lowermost stage STGL is transmitted.

The inspection pad 963 is disposed on the pad substrate ST7. The inspection pad 963 on the pad substrate ST7 may be electrically connected to the metal layer ML on the second dummy substrate ST4b by the additional connection line 962 on the additional connection substrate ST6. Accordingly, the gate signal output from the lowermost stage STGL may be transmitted to the inspection pad 963 through the metal layer ML of the second dummy substrate ST4b and the additional connection line 962.

The stretchable display device 900 according to still another embodiment of the present disclosure may simplify the structure of the inspection unit 960 in the lower non-display area NA2D. Specifically, an additional connection line 140 and a rigid substrate are necessary to transmit the gate signal output from the lowermost stage STGL to the plurality of flexible films 170 of the upper non-display area NA2U. Therefore, the gate signal output from the lowermost stage STGL is transmitted to the external equipment through the inspection pad 963 to perform the inspection. In this case, the plurality of second dummy substrates ST4b is connected to the second substrate ST2 on which the lowermost stage STGL is formed. The metal layer ML is formed on the plurality of second dummy substrates ST4b and the metal layer ML may serve as a wiring line which transmits a signal from the gate driver 150. Therefore, in the lower non-display area NA2D, the inspection pad 963 is directly connected to the plurality of second dummy substrates ST4b to receive the gate signal output from the lowermost stage STGL. Accordingly, in the stretchable display device 900 according to still another embodiment of the present disclosure, the inspection substrate ST5 of the inspection unit 960 is omitted in the lower non-display area NA2D and instead, the inspection pad 963 is electrically connected to the metal layer ML of the second dummy substrate ST4b to receive the gate signal. As a result, the structure of the inspection unit 960 may be simplified.

Figure 10:
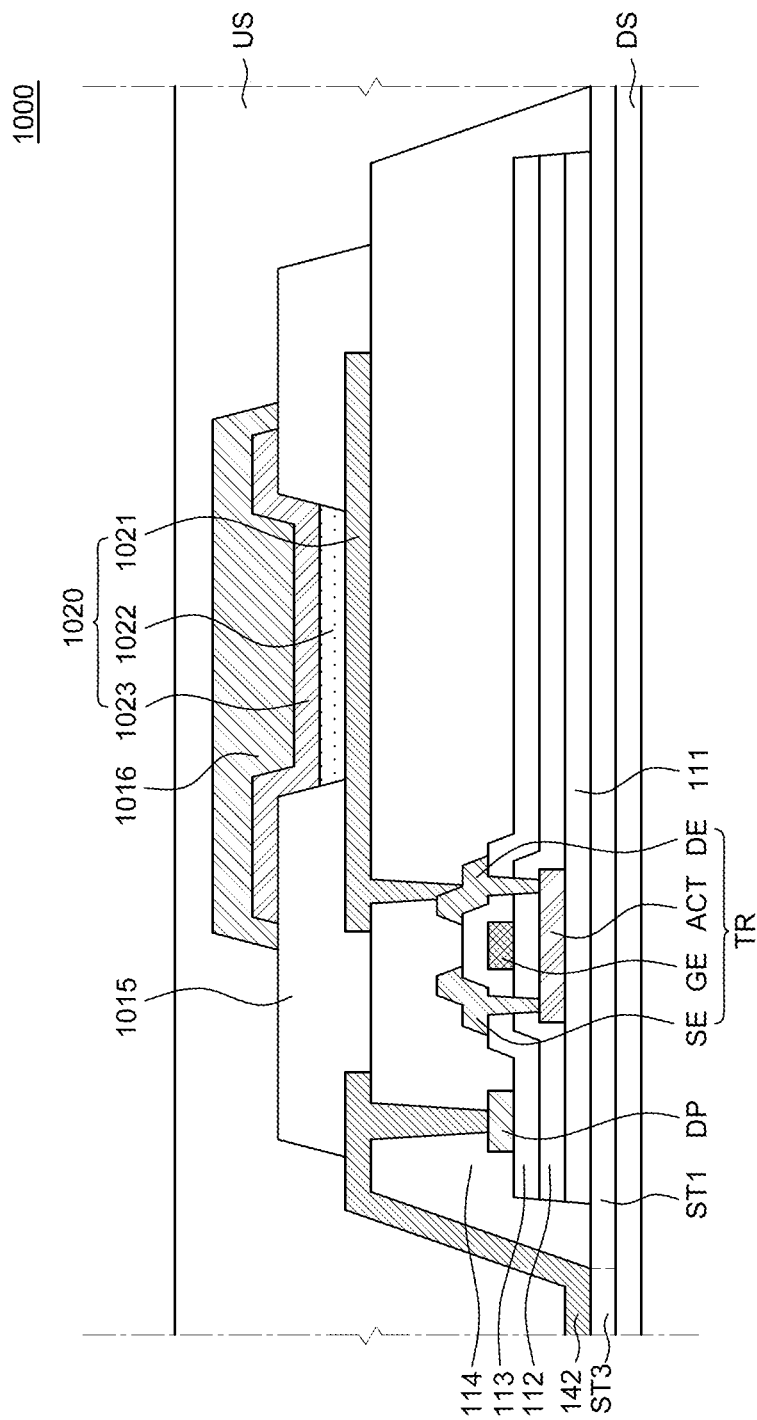
FIG. 10 is a cross-sectional view of a stretchable display device according to still another embodiment of the present disclosure.

FIG. 10 is a cross-sectional view of a stretchable display device according to still another embodiment of the present disclosure. As compared with the stretchable display device 100 illustrated in FIGS. 1 to 6, in a stretchable display device 1000 of FIG. 10, an organic light emitting diode 1020 is different and a bank 1015 and an encapsulation layer 1016 are further provided. However, the other configuration is substantially the same, so that a redundant description will be omitted.

Referring to FIG. 10, the organic light emitting diode 1020 is disposed to correspond to each of the plurality of sub pixels SPX and emits light having a specific wavelength band. That is, the organic light emitting diode 1020 may be a blue organic light emitting diode which emits blue light, a red organic light emitting diode which emits red light, a green organic light emitting diode which emits green light, or a white organic light emitting diode which emits white light, but is not limited thereto. When the organic light emitting diode 1020 is a white organic light emitting diode, the stretchable display device 1000 may further include a color filter.

The organic light emitting diode 1020 includes an anode 1021, an organic light emitting layer 1022, and a cathode 1023. Specifically, the anode 1021 is disposed on the planarization layer 114. The anode 1021 is an electrode configured to supply holes to the organic light emitting layer 1022. The anode 1021 may be configured by a transparent conductive material having a high work function. Here, the transparent conductive material may include indium tin oxide (ITO), indium zinc oxide (IZO), or indium tin zinc oxide (ITZO). Further, when the stretchable display device 1000 is implemented as a top emission type, the anode 1021 may further include a reflector.

The anodes 1021 are disposed to be spaced apart from each other for each of the sub pixels SPX to be electrically connected to the transistor TR through a contact hole of the planarization layer 114. For example, in FIG. 10, it is illustrated that the anode 1021 is electrically connected to the drain electrode DE of the transistor TR, but the anode 1021 may be electrically connected to the source electrode SE.

The bank 1015 is disposed on the anode 1021 and the planarization layer 114. The bank 1015 is a component which divides adjacent sub pixels SPX. The bank 1015 is disposed to cover at least a part of both sides of the adjacent anode 1021 to expose a part of a top surface of the anode 1021. The bank 1015 may suppress a problem in that a current is concentrated at the corner of the anode 1021 to emit the light to the side surface of the anode 1021 so that unintended sub pixel SPX emits light or colors are mixed. The bank 1015 may be formed of acrylic-based resin, benzocyclobutene (BCB)-based resin, or polyimide, but is not limited thereto.

The organic light emitting layer 1022 is disposed on the anode 1021. The organic light emitting layer 1022 is configured to emit light. The organic light emitting layer 1022 may include a luminescent material and the luminescent material may include a phosphorescent material or a fluorescent material, but is not limited thereto.

The organic light emitting layer 1022 may be configured by one emission layer. Alternatively, the organic light emitting layer 1022 may have a stack structure in which a plurality of emission layers laminated with a charge generation layer therebetween is laminated. Further, the organic light emitting layer 1022 may further include at least one of a hole transport layer, an electron transport layer, a hole blocking layer, an electron blocking layer, a hole injection layer, and an electron injection layer.

Referring to FIG. 10, the cathode 1023 is disposed on the organic light emitting layer 1022. The cathode 1023 supplies electrons to the organic light emitting layer 1022. The cathode 1023 may be formed of transparent conductive oxide such as indium tin oxide (ITO), indium zinc oxide (IZO), indium tin zinc oxide (ITZO), zinc oxide (ZnO), and tin oxide (TO) or ytterbium (Yb) alloy. Alternatively, the cathode 1023 may be formed of a metal material.

The cathode 1023 may be formed to be patterned to overlap the plurality of first substrates ST1. That is, the cathode 1023 is formed only in an area overlapping the plurality of first substrates ST1 and may not be formed in an area between the plurality of first substrates ST1. Since the cathode 1023 is formed of a material such as a transparent conductive oxide or a metal material, when the cathode 1023 is formed in the area between the plurality of first substrates ST1, the cathode 1023 may be damaged during the process of stretching the stretchable display device 1000. Therefore, the cathode 1023 may be formed so as to correspond to each of the plurality of first substrates ST1 on a flat surface. Referring to FIG. 10, the cathode 1023 may be formed to have an area which does not overlap the area where the connection line 140 is disposed, in an area overlapping the plurality of first substrates ST1.

Unlike the normal organic light emitting display device, in the stretchable display device 1000 according to still another embodiment of the present disclosure, the cathode 1023 is patterned so as to correspond to the plurality of first substrates ST1. Therefore, the cathode 1023 disposed on the plurality of first substrates ST1 may be independently supplied with a low potential power through the connection line 140.

In the meantime, in this specification, it has been described that the LED 120 or the organic light emitting diode 1020 is used as a display element, but a quantum dot light emitting diode (QLED) may also be used as the display element, and is not limited thereto.

The encapsulation layer 1016 is disposed on the organic light emitting diode 1020. The encapsulation layer 1016 covers the organic light emitting diode 1020 and is in contact with a part of the top surface of the bank 1015 to seal the organic light emitting diode 1020. Therefore, the encapsulation layer 1016 protects the organic light emitting diode 1020 from moisture, air, or physical impact permeating from the outside.

The encapsulation layer 1016 covers the cathode 1023 which is patterned to overlap the plurality of first substrates ST1 and is formed in each of the plurality of first substrates ST1. That is, the encapsulation layer 1016 is disposed so as to cover one cathode 1023 disposed in one first substrate ST1 and the encapsulation layer 1016 disposed on each of the plurality of first substrates ST1 may be spaced apart from each other.

The encapsulation layer 1016 may be formed only in an area overlapping the plurality of first substrates ST1. As described above, the encapsulation layer 116 may be configured to include an inorganic layer so that the encapsulation layer may be easily cracked or damaged during a process of stretching the stretchable display device 1000. Specifically, since the organic light emitting diode 1020 is vulnerable to the moisture or oxygen, when the encapsulation layer 1016 is damaged, the reliability of the organic light emitting diode 1020 may be reduced. Accordingly, the encapsulation layer 1016 may be formed only on the plurality of first substrates ST1 which are rigid substrates.

embodiments of the present disclosure can also be described as follows:

According to embodiments of the present disclosure, a stretchable display device comprises a lower substrate including a display area, a first non-display area disposed at a left side and a right side of the display area, and a second non-display area disposed above and below the display area and the first non-display area; a plurality of first substrates disposed on the lower substrate in the display area and defining a plurality of pixels; a plurality of second substrates disposed on the lower substrate in the first non-display area and including a gate driver disposed thereon; and an inspection unit disposed on the lower substrate in the second non-display area and including a plurality of inspection substrates connected to a second substrate which is the most adjacent to the second non-display area among the plurality of second substrates.

The inspection unit may further include a plurality of inspection patterns on the plurality of inspection substrates, the gate driver may include a plurality of stages on the plurality of second substrates, and an output signal of a first stage or a last stage among the plurality of stages may be transmitted to the plurality of inspection patterns.

The stretchable display device may further comprise a plurality of flexible films connected to the second non-display area at one side of the display area, and a printed circuit board electrically connected to the plurality of flexible films, wherein an inspection pattern disposed in the second non-display area at one side of the display area among the plurality of inspection patterns may be electrically connected to the plurality of flexible films.

The inspection unit may further include a pad substrate disposed in a second non-display area at the other side of the display area; and an inspection pad disposed on the pad substrate and electrically connected to the plurality of inspection patterns, and the output signal of the first stage or the last stage may be transmitted to the plurality of inspection patterns and the inspection pad.

The stretchable display device may further comprise a plurality of connection substrates connecting the plurality of first substrates to each other, the plurality of second substrates to each other, and the plurality of first substrates and the plurality of second substrates; and a plurality of connection lines on at least some of the plurality of connection substrates.

The inspection unit may further include a plurality of additional connection substrates which connects a connection substrate extending from the second substrate which is the most adjacent to the second non-display area toward the display area and the plurality of inspection substrates and connects inspection substrates which are adjacent in a vertical direction among the plurality of inspection substrates.

The inspection unit may further include an additional connection substrate connected to the plurality of inspection substrates and the additional connection substrate may include a first additional connection substrate connecting the second substrate which is the most adjacent to the second non-display area and the plurality of inspection substrates; and a second additional connection substrate connecting inspection substrates adjacent to each other in a vertical direction among the plurality of inspection substrates.

The inspection unit may further include a first additional connection line disposed on the first additional connection substrate and extending toward the plurality of inspection substrates; a second additional connection line disposed on the second additional connection substrate and extending toward the plurality of inspection substrates; and a plurality of insulating layers on the plurality of inspection substrates, and the first additional connection line and the second additional connection line may be electrically connected through contact holes of the plurality of insulating layers.

The stretchable display device may further comprise a plurality of dummy substrates disposed in the second non-display area; and a plurality of metal layers on at least some of the plurality of dummy substrates, wherein the plurality of connection lines may connect metal layers which are adjacent in the vertical direction, among the plurality of metal layers.

The plurality of connection substrates may connect the plurality of inspection substrates and the plurality of dummy substrates, respectively, and the plurality of connection lines may be disposed on the remaining connection substrates excluding a connection substrate which connects the plurality of inspection substrates and the plurality of dummy substrates, among the plurality of connection substrates.

The stretchable display device may further comprise a clamp disposed to overlap at least some of the plurality of dummy substrates.

According to some embodiments of the present disclosure, a stretchable display device comprises a lower substrate including a display area and a non-display area which encloses the display area; a plurality of first substrates defining a plurality of pixels and disposed in the display area to be spaced apart from each other; a plurality of second substrates disposed in a left non-display area at a left side of the display area and in a right non-display area at a right side of the display area, in the non-display area; gate drivers disposed on the plurality of second substrates and including a plurality of stages; and a plurality of inspection substrates disposed in an upper non-display area above the display area and a lower non-display area below the display area in the non-display area and having a plurality of inspection patterns disposed thereon, wherein a gate signal output from an uppermost stage disposed on an uppermost second substrate which is the most adjacent to the upper non-display area among the plurality of stages may be transmitted to the plurality of pixels and the plurality of inspection patterns and a gate signal output from a lowermost stage disposed on a lowermost second substrate which is the most adjacent to the lower non-display area among the plurality of stages may be transmitted to the plurality of pixels and the plurality of inspection patterns.

The stretchable display device may further comprise a plurality of connection substrates connecting the plurality of first substrates and the plurality of second substrates; a plurality of connection lines disposed on the plurality of connection substrates to electrically connect the plurality of stages to the plurality of pixels; an additional connection substrate connecting a connection substrate connected to the uppermost second substrate and the lowermost second substrate, among the plurality of connection substrates, and the plurality of inspection substrates; and an additional connection line disposed on the additional connection substrate to electrically connect the plurality of connection lines and the plurality of inspection patterns.

The stretchable display device may further comprise a first additional connection substrate connecting an inspection substrate which is the most adjacent to the uppermost second substrate and the uppermost second substrate and connecting an inspection substrate which is the most adjacent to the lowermost second substrate and the lowermost second substrate; a first additional connection line disposed on the first additional connection substrate to electrically connect the plurality of stages and plurality of inspection patterns; a second additional connection substrate connecting adjacent inspection substrates among the plurality of inspection substrates; and a second additional connection line disposed on the second additional connection substrate and electrically connecting the plurality of inspection patterns to each other.

The stretchable display device may further comprise one or more insulating layers disposed on the plurality of inspection substrates and include a contact hole, wherein the first additional connection line may extend onto the plurality of inspection substrates to be disposed on one surface of the insulating layer, and the second additional connection line may extend onto the plurality of inspection substrates to be disposed on an opposite surface of the one surface of the insulating layer, and the plurality of inspection patterns, the first additional connection line, and the second additional connection line may be electrically connected to each other on the plurality of inspection substrates, through the contact hole.

The stretchable display device may further comprise a plurality of dummy substrates disposed at a left side and a right side of the plurality of inspection substrates; and a plurality of metal layers on at least some of the plurality of dummy substrates, wherein the plurality of inspection patterns may be electrically insulated from the plurality of metal layers.

The stretchable display device may further comprise a plurality of flexible films electrically connected to the upper non-display area; a printed circuit board electrically connected to the plurality of flexible films; and a pad substrate disposed in the lower non-display area and having an inspection pad electrically connected to the plurality of inspection patterns, wherein a gate signal output from the uppermost stage may be transmitted to the plurality of flexible films and the printed circuit board through the plurality of inspection patterns, and a gate signal output from the lowermost stage may be transmitted to external equipment through the plurality of inspection patterns and the inspection pad.

Although some embodiments of the present disclosure have been described in detail with reference to the accompanying drawings, the present disclosure is not limited thereto and may be embodied in many different forms without departing from the technical concept of the present disclosure. Therefore, some embodiments of the present disclosure are provided for illustrative purposes only but not intended to limit the technical concept of the present disclosure. The scope of the technical concept of the present disclosure is not limited thereto. Therefore, it should be understood that the above-described embodiments are illustrative in all aspects and do not limit the present disclosure. All the technical concepts in the equivalent scope thereof should be construed as falling within the scope of the present disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stretchable display device, comprising:
    a lower substrate having formed thereon a display area, a first non-display area adjacent to a first side of the display area and a second side of the display area opposite of the first side, and a second non-display area adjacent to a third side of the display area and a fourth side of the display area opposite of the third side, wherein the third side of the display area is adjacent to the first and second sides of the display area and the fourth side of the display area is adjacent to the first and second sides of the display area;
    a plurality of first substrates on the lower substrate in the display area and having thereon a plurality of pixels;
    a plurality of second substrates on the lower substrate in the first non-display area and including a gate driver disposed thereon; and
    an inspection circuitry on the lower substrate in the second non-display area and including a plurality of inspection substrates connected to a second substrate among the plurality of second substrates that is the most adjacent to the second non-display area, and
    wherein the plurality of first substrates are spaced apart from each other and disposed along a first direction and a second direction transverse to the first direction,
    wherein the plurality of second substrates are spaced apart from each other and disposed along the first direction and the second direction, and
    wherein the inspection circuitry further includes a plurality of inspection patterns on the plurality of inspection substrates, the gate driver includes a plurality of stages on the plurality of second substrates, and an output signal from at least one of a first stage or a last stage among the plurality of stages is transmitted to the plurality of inspection patterns.

2. The stretchable display device according to claim 1, further comprising:
    a plurality of flexible films connected to the second non-display area at the third side of the display area, and
    a printed circuit board electrically connected to the plurality of flexible films,
    wherein an inspection pattern disposed in the second non-display area at the third side of the display area among the plurality of inspection patterns is electrically connected to the plurality of flexible films.

3. The stretchable display device according to claim 1, wherein the inspection unit further includes:
    a pad substrate disposed in the second non-display area at the fourth side of the display area; and
    an inspection pad disposed on the pad substrate and electrically connected to the plurality of inspection patterns, and
    the output signal of the first stage or the last stage is transmitted to the plurality of inspection patterns and the inspection pad.

4. The stretchable display device according to claim 1, further comprising:
    a plurality of connection substrates connecting the plurality of first substrates to each other, the plurality of second substrates to each other, and the plurality of first substrates and the plurality of second substrates; and
    a plurality of connection lines on at least some of the plurality of connection substrates.

5. The stretchable display device according to claim 4, wherein the inspection circuitry further includes a plurality of additional connection substrates which connects a connection substrate extending from the second substrate which is the most adjacent to the second non-display area toward the display area and the plurality of inspection substrates and connects inspection substrates which are adjacent in a vertical direction among the plurality of inspection substrates.

6. The stretchable display device according to claim 4, further comprising:
    a plurality of dummy substrates disposed in the second non-display area; and
    a plurality of metal layers on at least some of the plurality of dummy substrates,
    wherein the plurality of connection lines connects metal layers which are adjacent in the vertical direction, among the plurality of metal layers.

7. The stretchable display device according to claim 6, wherein the plurality of connection substrates connects the plurality of inspection substrates and the plurality of dummy substrates, respectively, and the plurality of connection lines is disposed on the remaining connection substrates excluding a connection substrate which connects the plurality of inspection substrates and the plurality of dummy substrates, among the plurality of connection substrates.

8. The stretchable display device according to claim 6, further comprising:
    a clamp disposed to overlap at least some of the plurality of dummy substrates.

9. The stretchable display device according to claim 1, wherein the inspection circuitry further includes an additional connection substrate connected to the plurality of inspection substrates and the additional connection substrate includes:
    a first additional connection substrate connecting the second substrate which is the most adjacent to the second non-display area and the plurality of inspection substrates; and
    a second additional connection substrate connecting inspection substrates adjacent to each other in a vertical direction among the plurality of inspection substrates.

10. The stretchable display device according to claim 9, wherein the inspection circuitry further includes:
    a first additional connection line disposed on the first additional connection substrate and extending toward the plurality of inspection substrates;

a second additional connection line disposed on the second additional connection substrate and extending toward the plurality of inspection substrates; and an insulating layer on the plurality of inspection substrates, and the first additional connection line and the second additional connection line are electrically connected through a contact hole of the insulating layer.

11. A stretchable display device, comprising:

a lower substrate having thereon a display area and a non-display area which encloses the display area;

a plurality of first substrates defining a plurality of pixels and disposed in the display area to be spaced apart from each other;

a plurality of second substrates disposed in a left non-display area at a left side of the display area and in a right non-display area at a right side of the display area, in the non-display area;

gate drivers disposed on the plurality of second substrates and including a plurality of stages; and a plurality of inspection substrates disposed in an upper non-display area above the display area and a lower non-display area below the display area in the non-display area and having a plurality of inspection patterns disposed thereon, wherein a gate signal output from an uppermost stage disposed on an uppermost second substrate which is the most adjacent to the upper non-display area among the plurality of stages is transmitted to the plurality of pixels and the plurality of inspection patterns and a gate signal output from a lowermost stage disposed on a lowermost second substrate which is the most adjacent to the lower non-display area among the plurality of stages is transmitted to the plurality of pixels and the plurality of inspection patterns.

12. The stretchable display device according to claim 11, further comprising:

a plurality of connection substrates connecting the plurality of first substrates and the plurality of second substrates;

a plurality of connection lines disposed on the plurality of connection substrates to electrically connect the plurality of stages to the plurality of pixels;

an additional connection substrate connecting a connection substrate connected to the uppermost second substrate and the lowermost second substrate, among the plurality of connection substrates, and the plurality of inspection substrates; and an additional connection line disposed on the additional connection substrate to electrically connect the plurality of connection lines and the plurality of inspection patterns.

13. The stretchable display device according to claim 11, further comprising:

a first additional connection substrate connecting an inspection substrate which is the most adjacent to the uppermost second substrate and the uppermost second substrate and connecting an inspection substrate which is the most adjacent to the lowermost second substrate and the lowermost second substrate;

a first additional connection line disposed on the first additional connection substrate to electrically connect the plurality of stages and plurality of inspection patterns;

a second additional connection substrate connecting adjacent inspection substrates among the plurality of inspection substrates; and a second additional connection line disposed on the second additional connection substrate and electrically connecting the plurality of inspection patterns to each other.

14. The stretchable display device according to claim 13, further comprising:

one or more insulating layers disposed on the plurality of inspection substrates and include a contact hole, wherein the first additional connection line extends onto the plurality of inspection substrates to be disposed on one surface of the insulating layer, and the second additional connection line extends onto the plurality of inspection substrates to be disposed on an opposite surface of the one surface of the insulating layer, and the plurality of inspection patterns, the first additional connection line, and the second additional connection line are electrically connected to each other on the plurality of inspection substrates, through the contact hole.

15. The stretchable display device according to claim 11, further comprising:

a plurality of dummy substrates disposed at a left side and a right side of the plurality of inspection substrates; and a plurality of metal layers on at least some of the plurality of dummy substrates, wherein the plurality of inspection patterns is electrically insulated from the plurality of metal layers.

16. The stretchable display device according to claim 11, further comprising:

a plurality of flexible films electrically connected to the upper non-display area;

a printed circuit board electrically connected to the plurality of flexible films; and a pad substrate disposed in the lower non-display area and having an inspection pad electrically connected to the plurality of inspection patterns, wherein a gate signal output from the uppermost stage is transmitted to the plurality of flexible films and the printed circuit board through the plurality of inspection patterns, and a gate signal output from the lowermost stage is transmitted to external equipment through the plurality of inspection patterns and the inspection pad.

17. A display device, comprising:

a base substrate;

a plurality of first substrates on the base substrate, each of the first substrates being spaced apart from each other and each of the first substrates having thereon one or more pixels, wherein the one or more pixels on the plurality of first substrates form a display area;

a plurality of second substrates on the base substrate and adjacent to the plurality of first substrates, each of the second substrates being spaced apart from each other, at least one of the plurality of second substrates having a gate driver disposed thereon, wherein the plurality of second substrates are in a non-display area adjacent to the display area; and a plurality of inspection substrates on the base substrate, at least one of the plurality of inspection substrates being connected to a nearest second substrate among the plurality of second substrates, wherein the plurality of inspection substrates are in the non-display area, wherein the plurality of first substrates are spaced apart from each other and disposed along a first direction and a second direction transverse to the first direction, wherein the plurality of second substrates are spaced apart from each other and disposed along the first direction and the second direction, and further comprising an inspection circuitry including a plurality of inspection patterns on the plurality of inspection substrates, the gate driver includes a plurality of stages on the plurality of second substrates, and an output signal from at least one of a first stage or a last stage among the plurality of stages is transmitted to the plurality of inspection patterns.

18. The display device according to claim 17, further comprising:
   a first dummy substrate in the non-display area;
   a second dummy substrate adjacent to the first dummy substrate in the non-display area, wherein at least one of the plurality of inspection substrates are between the first dummy substrate and the second dummy substrate.

19. The display device according to claim 18, wherein the first dummy substrate is connected to at least one first substrate, and the second dummy substrate is connected to at least one second substrate.

* * * * *